(12) United States Patent
Suganaga

(10) Patent No.: US 6,295,629 B1
(45) Date of Patent: Sep. 25, 2001

(54) FOCUS CORRECTING METHOD AND METHOD OF MANUFACTURING SEMICONDUCTOR DEVICE

(75) Inventor: Toshifumi Suganaga, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/266,917

(22) Filed: Mar. 12, 1999

(30) Foreign Application Priority Data

Oct. 26, 1998  (JP) .................................................. 10-303690

(51) Int. Cl.[7] .................................................. G06F 17/50
(52) U.S. Cl. .................................................. 716/4; 430/5
(58) Field of Search .................. 716/4; 257/620; 364/578; 430/5

(56) References Cited

U.S. PATENT DOCUMENTS

| | | | |
|---|---|---|---|
| 5,436,097 | * 7/1995 | Norishima et al. | 430/5 |
| 5,591,958 | * 1/1997 | Nishi et al. | 250/205 |
| 5,800,949 | * 9/1998 | Edo et al. | 430/5 |
| 5,990,540 | * 11/1999 | Yokoya | 257/620 |

FOREIGN PATENT DOCUMENTS

| | | |
|---|---|---|
| 5-190419 | 7/1993 | (JP) . |
| 7-86135 | 3/1995 | (JP) . |
| 9-92606 | 4/1997 | (JP) . |

* cited by examiner

*Primary Examiner*—David Nelms
*Assistant Examiner*—Thong Le
(74) *Attorney, Agent, or Firm*—Oblon, Spivak, McClelland, Maier & Neustadt, P.C.

(57) ABSTRACT

Disclosed herein is how to obtain the magnitude of focus deviation and the direction of the deviation directly from a focus measuring mark. The magnitude of focus deviation is measured from the length of the focus measuring mark (3) in the elongate direction. The length of a tapered part (20) of the focus measuring mark (3) in which the resist gradually becomes thinner is measured from the secondary electron signal waveform of a scanning electron microscope. The direction of the focus deviation is obtained from the measured length of the tapered part (20).

10 Claims, 22 Drawing Sheets

0            10 μm

FOCUS CORRECTING METHOD AND METHOD OF MANUFACTURING SEMICONDUCTOR DEVICE

BACKGROUND OF THE INVENTION

1. Field of the Invention

The present invention relates to a method for correcting focus in an aligner (stepper) and a method for manufacturing semiconductor devices by using an aligner in which focus is corrected by the focus correcting method.

2. Description of the Background Art

Conventionally, the management of focusing of aligners includes the focus calibration performed several times a day (the management in which the distance between the stage and reticle is measured and the variation is fed back to focusing in exposure), the best focus check performed several times a month by forming resist pattern by using a test reticle (the management in which resist pattern is formed and the deviation of the present focusing value from the best focus is calculated by viewing, or by measuring dimensions of the test pattern and is fed back to the aligner), and the leveling function check (the management in which the inclination of the wafer plane and the image plane of the shots in the aligner is measured and adjusted). These management processes are too time consuming to perform frequently, and therefore periodical variation of focus of the aligner having several-hour or shorter cycle cannot be followed, which leads to increased variation of the resist pattern due to defocusing.

As conventional aligners, for example, Japanese Patent Laying-Open Gazette No.9-92606 discloses a device which adjusts focus on the basis of correction data obtained from level marks formed on the wafer, Japanese Patent Laying-Open Gazette No.5-190419 discloses a device which adjusts focus by using test pattern formed on a test substrate, and Japanese Patent Laying-Open Gazette No.7-86135 discloses a device which adjusts focus with weighted focus information to compensate for phase lag of focusing signal.

In the conventional focus correcting methods performed as stated above, it is difficult to measure the focus deviation, and therefore the focus deviation cannot be measured for each lot manufactured in short cycle so that the measured deviation can be utilized for the next lot, which raises the problem of difficulty in improving the focus correcting accuracy.

SUMMARY OF THE INVENTION

According to a first aspect of the present invention, a focus correcting method for use in an aligner capable of adjustment of focus position by setting a focusing value comprises the steps of: (a) forming a resist pattern with at least one focus measuring mark by exposing a resist by the aligner; (b) measuring length of the at least one focus measuring mark in elongate direction; (c) measuring length of a tapered part of the at least one focus measuring mark in which the resist becomes thinner toward an end of the at least one focus measuring mark; and (d) determining a magnitude of deviation from a best focus on the basis of a measurement in the step (b) and also determining direction of the deviation from the best focus on the basis of a measurement in the step (c) to obtain a deviation amount from the best focus, and then setting the focusing value on the basis of the deviation amount from the best focus.

Preferably, according to a second aspect, the focus correcting method further comprises the step of (e) storing data about the deviation amount from the best focus every time the step (d) is repeated for each of a plurality of sets of products of a same type, and the step (d) comprises the step of statistically processing the data to calculate a predicted focusing value which enables the best focus in exposure, and setting the focusing value on the basis of the predicted focusing value.

Preferably, according to a third aspect, in the focus correcting method, the step (e) comprises the step of defining a sum of the focusing value and the deviation amount from the best focus as a true deviation, and storing the true deviations about the plurality of sets of products as the data, and in the step (d), the true deviations about a predetermined number of sets of products are extracted from the data stored in the step (e) and an average value of the true deviations about the predetermined number of sets of products is used as the predicted focusing value.

Preferably, according to a fourth aspect, in the focus correcting method, in the step (d), true deviations about a predetermined number of sets of products are calculated from the data stored, a value proportional to a difference between the true deviations about successively manufactured at least two sets of products in the plurality of sets of products is added to an average value of the true deviations about the predetermined number of sets of products, and a sum of the average value and the difference is used as the predicted focusing value.

Preferably, according to a fifth aspect, in the focus correcting method, the at least one focus measuring mark is including a plurality of focus measuring marks, and with the plurality of focus measuring marks arranged in one shot, inclination of the shot is calculated on the basis of the true deviations of the resist pattern from the best focus in individual positions of the plurality of focus measuring marks, and the predicted focusing value is obtained by considering the inclination.

Preferably, according to a sixth aspect, in the focus correcting method, the at least one focus measuring mark is including a plurality of focus measuring marks, and with the plurality of focus measuring marks arranged in peripheral part and center part of one shot, the predicted focusing value is calculated on the basis of a value between the true deviation from the best focus in the peripheral part of the shot and the true deviation from the best focus in the center part of the shot.

Preferably, according to a seventh aspect, in the focus correcting method, the at least one focus measuring mark is including a plurality of focus measuring marks, and with the plurality of focus measuring marks arranged in a plurality of positions in one shot, the true deviations from the best focus measured at the plurality of positions are weighted in accordance with pattern layout and arrangement in the shot and averaged so as to calculate the predicted focusing value.

Preferably, according to an eighth aspect, in the focus correcting method, the at least one focus measuring mark is including a plurality of focus measuring marks, and with one of the plurality of focus measuring marks arranged in one position in one shot, an amount of remaining warp of the wafer is calculated on the basis of the deviation amounts of the plurality of focus measuring marks formed in several positions on the wafer in a plurality of exposures and the predicted focusing value is obtained by considering the amount of remaining warp.

Preferably, according to a ninth aspect, in the focus correcting method, the at least one focus measuring mark is a polygon having at least one corner having an angle of 90° or smaller.

A tenth aspect of the present invention is directed to a method of manufacturing a semiconductor device using an aligner in which focus is corrected by using a given focus correcting method and focus position can be adjusted by setting a focusing value. According to the tenth aspect, the semiconductor device manufacturing method comprises the steps of: (a) setting the focusing value; and (b) manufacturing semiconductor devices by using the aligner in which the focus position is adjusted by setting the focusing value. The step (a) comprises the steps of: (c) forming a resist pattern with at least one focus measuring mark by exposing a resist by the aligner; (d) measuring length of the at least one focus measuring mark in elongate direction; (e) measuring length of a tapered part of the at least one focus measuring mark in which the resist becomes thinner toward an end of the at least one focus measuring mark; and (f) determining a magnitude of deviation from a best focus on the basis of a measurement in the step (d) and also determining direction of the deviation from the best focus on the basis of a measurement in the step (e) to obtain a deviation amount from the best focus, and then setting the focusing value on the basis of the deviation amount from the best focus.

As described above, according to the focus correcting method of the first aspect or the method of manufacturing the semiconductor device of the tenth aspect, the steps (b), (c) or (d), (e) are performed for each production of products, and then the deviation from the best focus can easily be measured for each product. Hence the focusing value can be set at shorter cycle than in conventional methods so as to improve the accuracy of the focus correction.

According to the focus correcting method of the second aspect, a predicted focusing value is calculated on the basis of past data about deviations from the best focus and the focusing value is set on the basis of this predicted focusing value. This provides the effect of enhancing the accuracy of the focus correction as compared with that in processes in which the focusing value is not predicted.

According to the focus correcting method of the third aspect, the predicted focusing value can easily be obtained and the accuracy of the focus correction can easily be enhanced.

According to the focus correcting method of the fourth aspect, adding the variation term to the average value of true deviations enhances the correctness of the predicted focusing value, which enhances the correctness of the focus correction as compared with process in which the average value is used as the predicted focusing value.

According to the focus correcting method of the fifth aspect, the focus can be corrected with correction to error due to inclination of the shot, which improves the accuracy of the focus correction.

According to the focus correcting method of the sixth aspect, the focus can be corrected while considering the image plane curve in the shot, which enhances the accuracy of the focus correction.

According to the focus correcting method of the seventh aspect, it is possible to intensively enhance the focus correcting accuracy in areas requiring higher accuracy.

According to the focus correcting method of the eighth aspect, focusing can be accomplished while reflecting the difference in amount of remaining warp of a wafer, without the need of measuring focus condition for all shots on the wafer.

According to the focus correcting method of the ninth aspect, when a corner at 90° degrees or smaller is used, the focus measuring mark can provide a larger tapered part to indicate the direction of focus deviation, and then the deviation from the best focus can easily be measured.

The present invention has been made to solve the above-described problems, and an object of the present invention is to enable easy measurement of defocus so that the focus correction can be performed for each lot.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
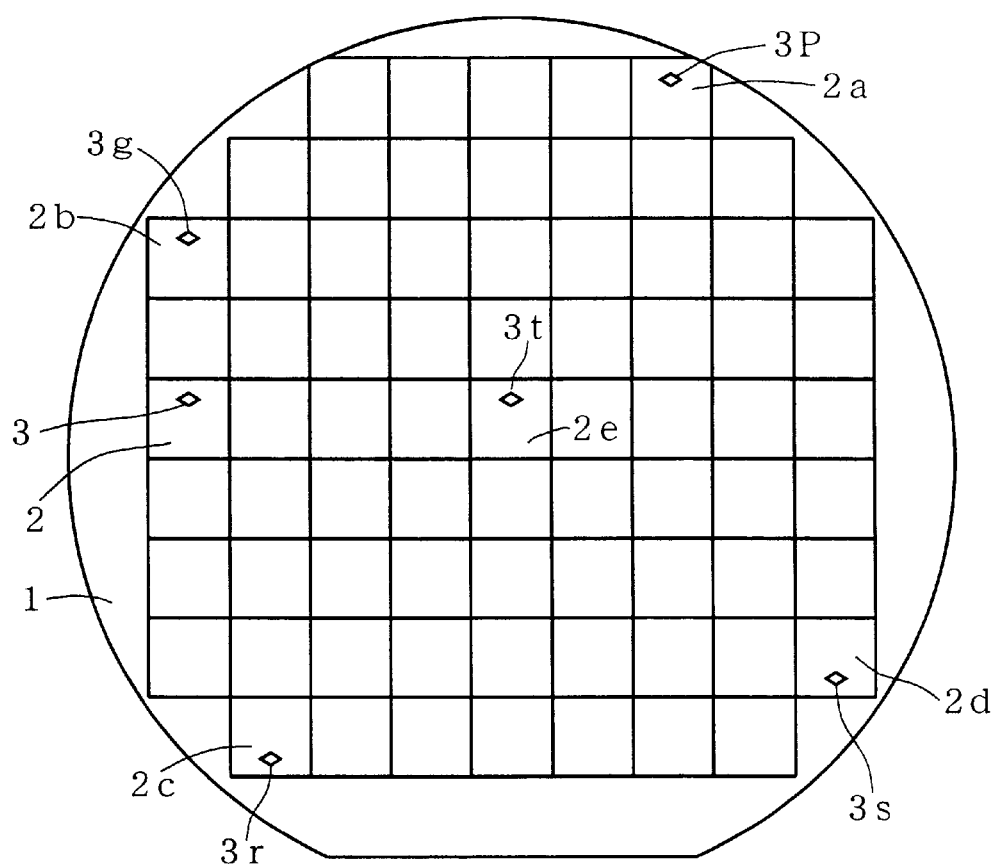
FIG. 1 is a conceptual diagram showing the relation among a wafer, shots, and focus measuring marks.
Figure 2:
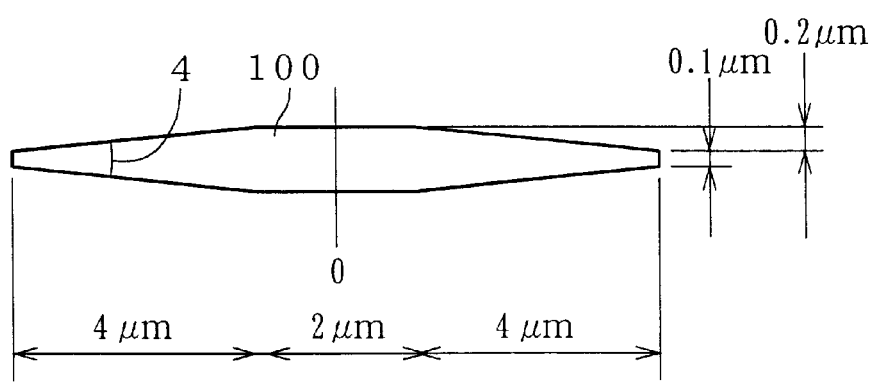
FIG. 2 is a plane view showing an example of the shape of the focus measuring mark.

A focus correcting method according to a first preferred embodiment will now be described referring to FIG. 1 to FIG. 32. FIG. 1 is a conceptual diagram showing the relation among a wafer, shot region (hereinafter simply referred to as a shot), and focus measuring marks. In FIG. 1, a plurality of shots 2 are arranged by multiple times of exposures on a single wafer 1. While one shot 2 has at least one focus measuring mark 3 and therefore a plurality of focus measuring marks 3 are formed on the wafer 1, FIG. 1 shows only part of the focus measuring marks 3. The focus measuring marks 3 are formed by using a reticle on which the figure 100 shaped as shown in the plane view of FIG. 2 is drawn, for example. Aside from the corners 4 shaved off, the FIGURE 100 of FIG. 2 can be considered to be a hexagon having the corners 4 with an angle smaller than 90°. This Figure 100 has a length of 10 μm in the elongate direction and a total width of 0.5 μm. In the laterally long focus measuring mark 3, the part extending in 1 μm on right and left sides of the center position O in the elongate direction has the width of 0.5μm. The focus measuring mark 3 becomes linearly thinner from the distances 1 μm away from the center O toward the right and left ends, and the ends have a width of 0.1μm.

With the aligner (stepper), resist film applied on the wafer 1 is repeatedly exposed in predetermined pattern of arrangement of the shots 2 containing the focus measuring marks 3. The areas exposed to light or the areas not exposed to light are removed from the resist film, and the patterning is thus completed. When the aligner goes out of the correct best focus in exposure, the shape of the given pattern including the focus measuring marks 3 then changes.

Figure 3:
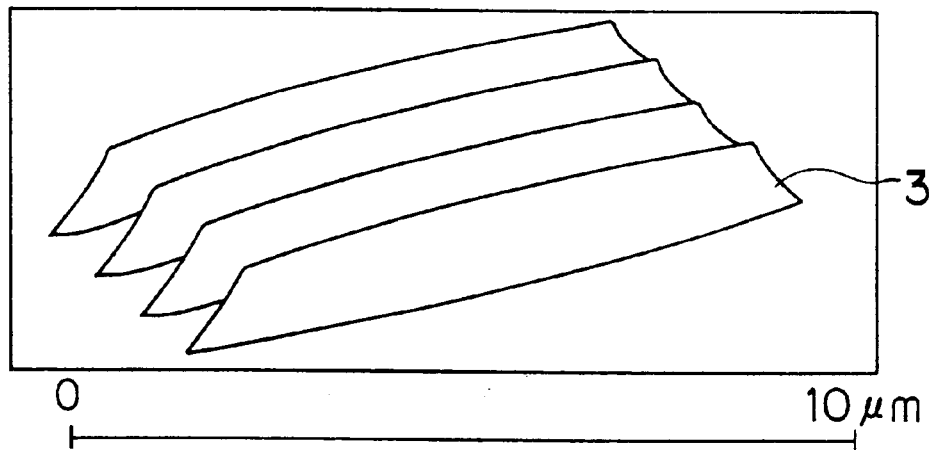
FIGS. 3 to 20 are pictorial views showing first to eighteenth examples of the focus measuring marks observed by a scanning electron microscope, respectively.
Figure 4:
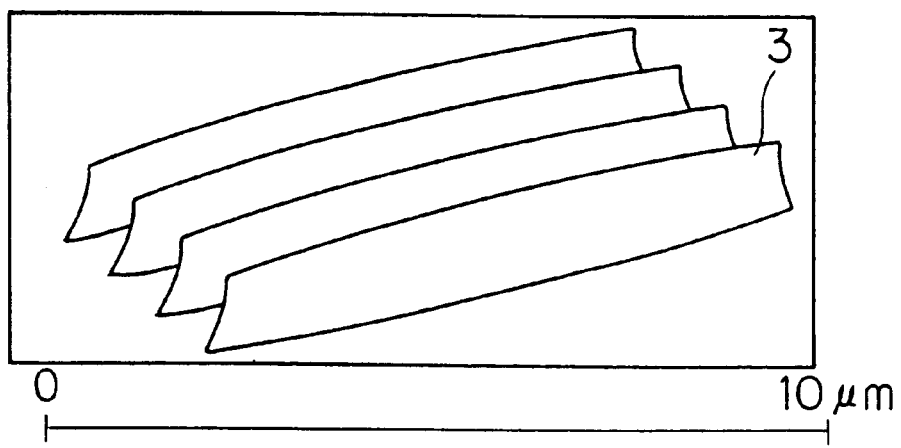
Figure 5:
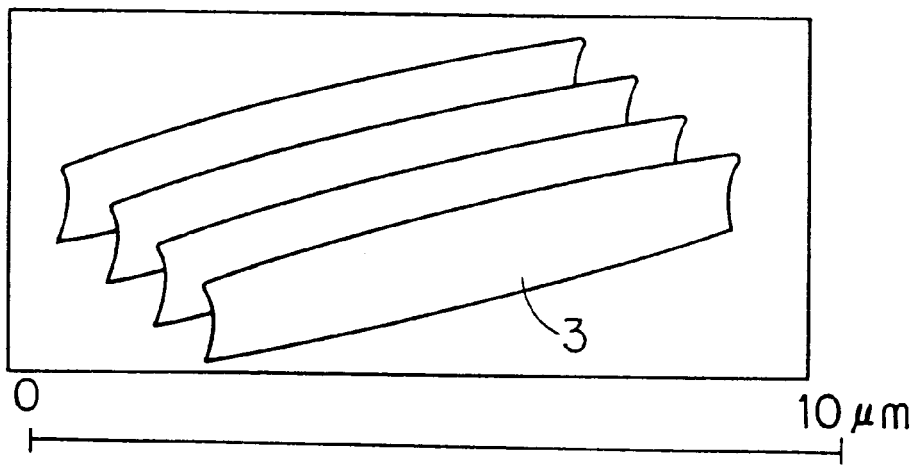
Figure 6:
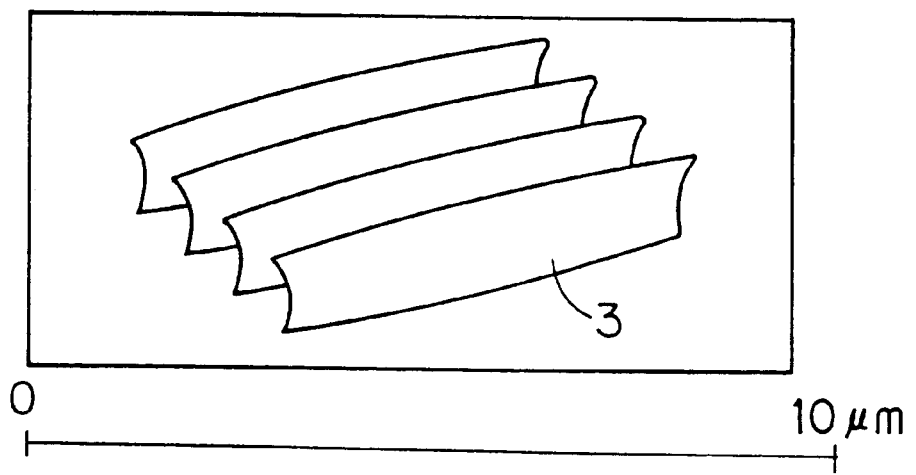
Figure 7:
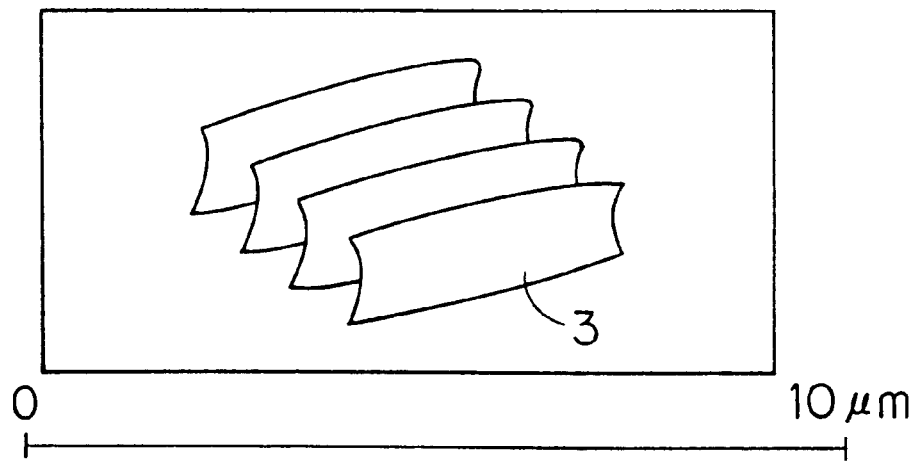
Figure 8:
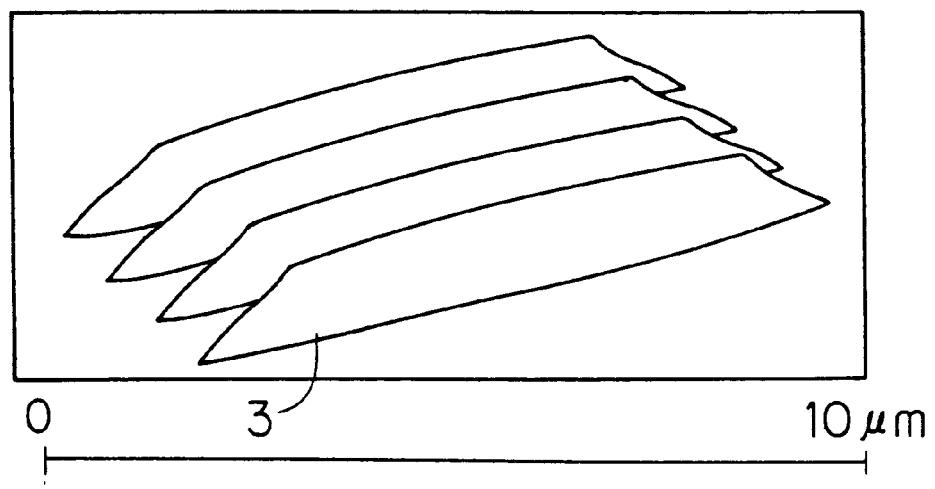
Figure 9:
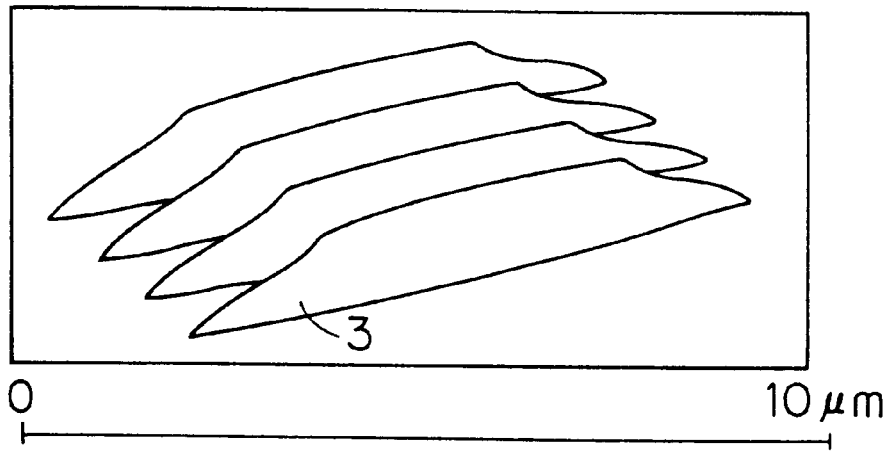
Figure 10:
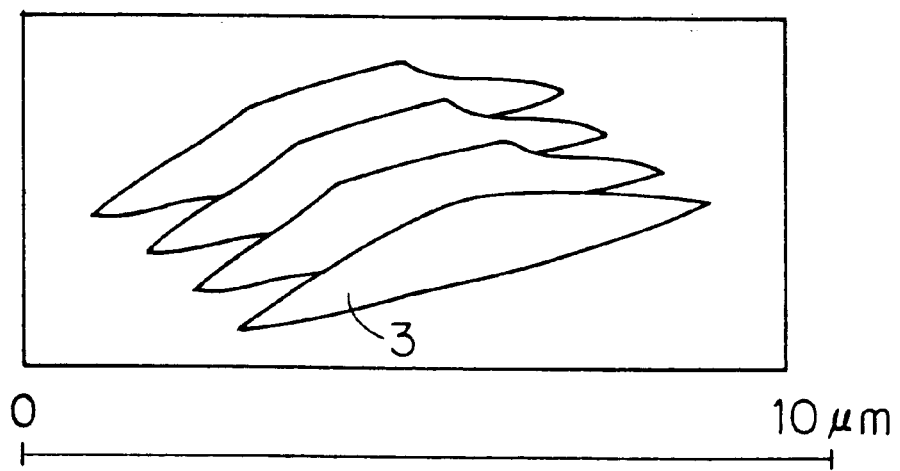
Figure 11:
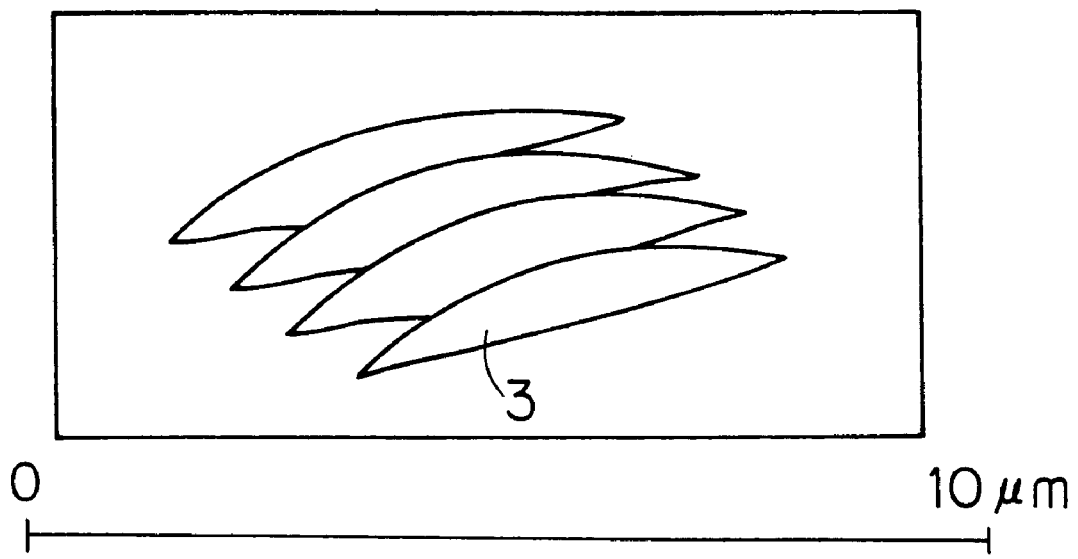

FIGS. 3 to 11 are diagrams showing images obtained by observing the focus measuring marks 3 with a scanning electron microscope. FIGS. 3 to 11 show the focus measuring marks 3 patterned in different focus conditions, which are obliquely observed at a magnification of X10,000. These focus measuring marks 3 are made of four of the shape of FIG. 2 arranged in parallel. FIG. 3 shows the focus measuring marks 3 in the best focus condition. FIGS. 4 to 7 show the focus measuring marks 3 formed in out-of-focus conditions deviated from the best focus by −0.4, −0.8, −1.2, and −1.6 (μm), respectively. FIGS. 8 to 11 show the focus measuring marks 3 formed in out-of-focus conditions deviated from the best focus by 0.4, 0.8, 1.2, and 1.6 (μm), respectively.

Figure 12:
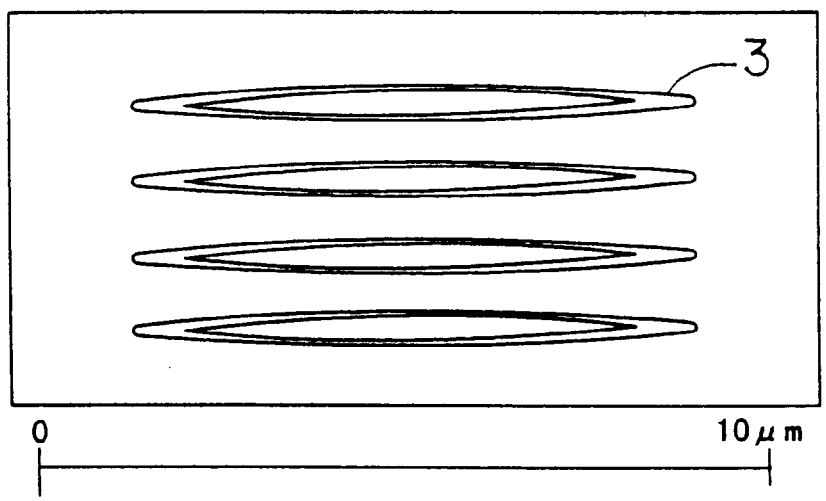
Figure 13:
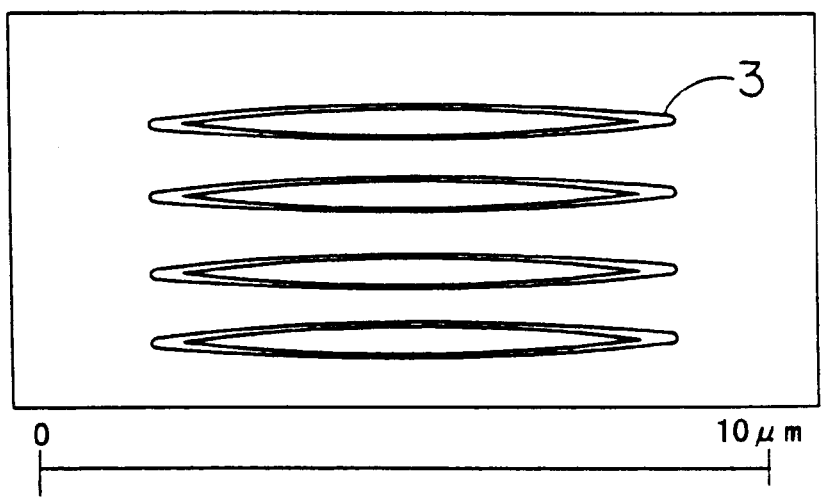
Figure 14:
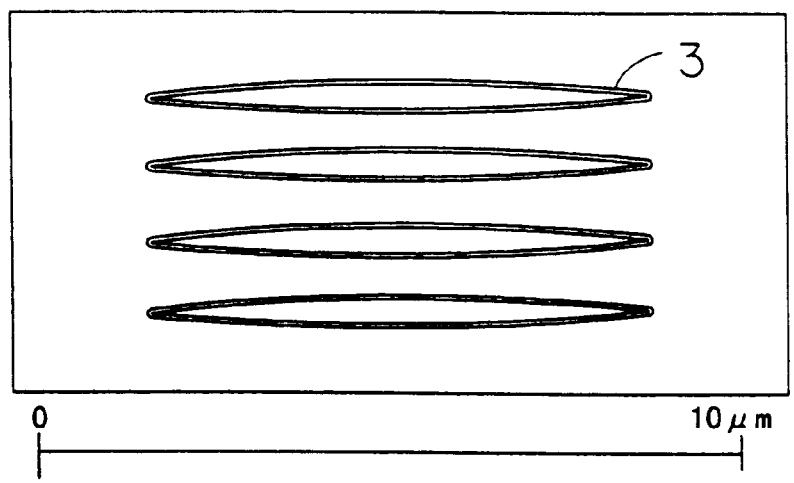
Figure 15:
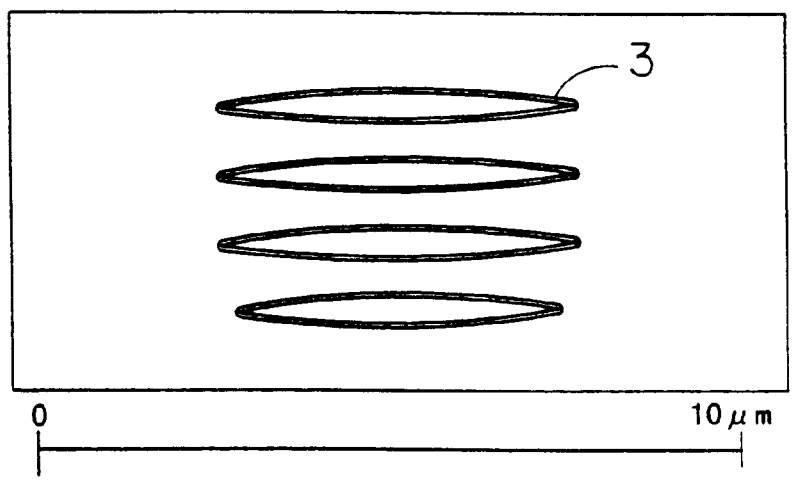
Figure 16:
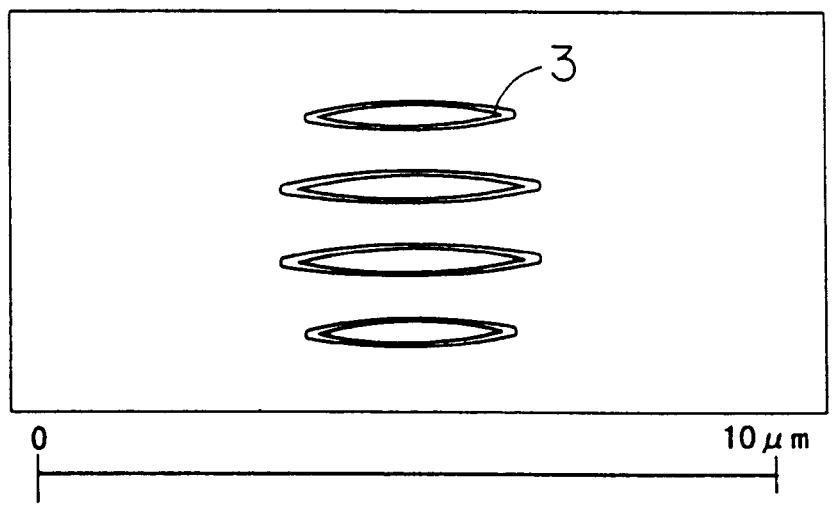
Figure 17:
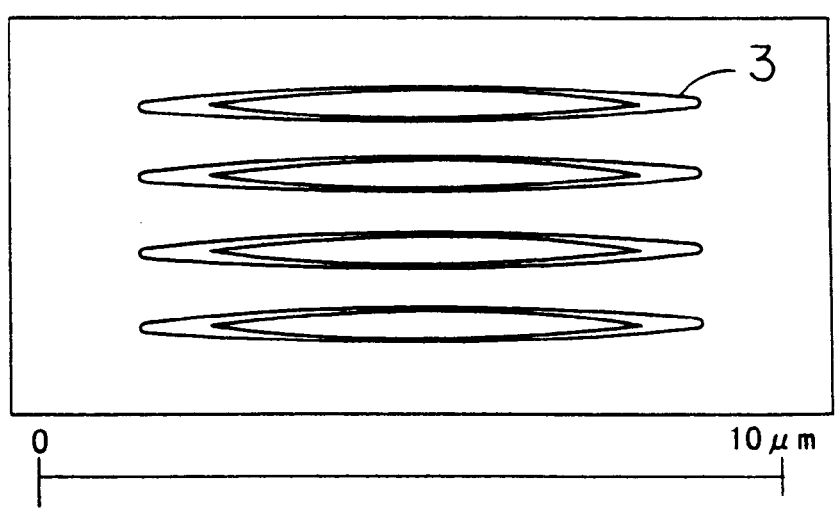
Figure 18:
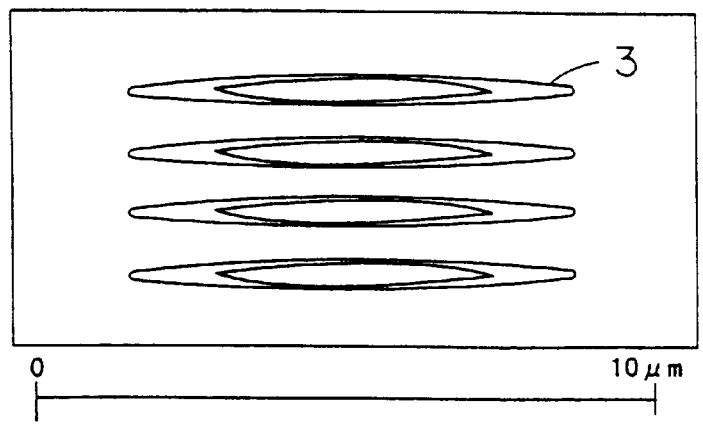
Figure 19:
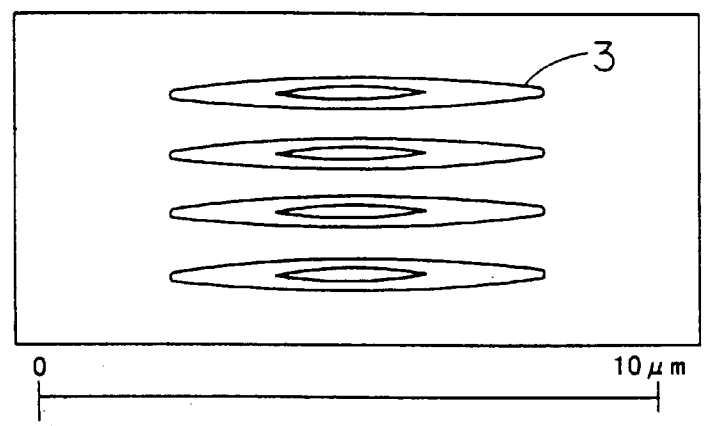
Figure 20:
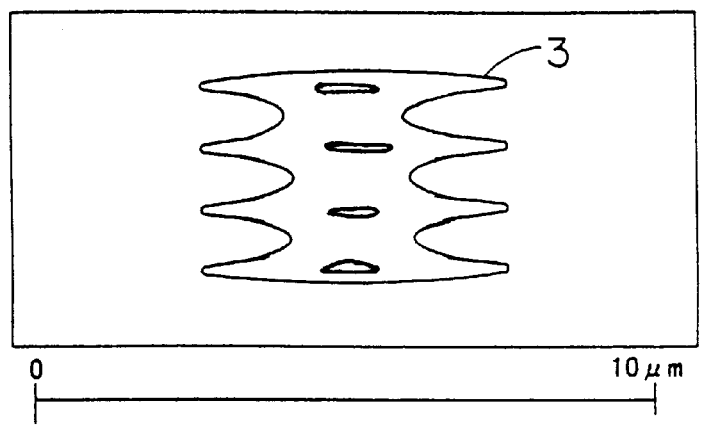

Also, FIGS. 12 to 20 are diagrams showing images obtained by observing four focus measuring marks 3 with a scanning electron microscope. FIGS. 12 to 20 show the focus measuring marks 3 patterned in different focus conditions, which are observed from right above at a magnification of X7,500. FIG. 12 shows the focus measuring marks 3 in the best focus condition. FIGS. 13 to 16 show the focus measuring marks 3 formed in out-of-focus conditions deviated from the best focus by 0.4, −0.8, −1.2, and −1.6 (μm), respectively. FIGS. 17 to 20 show the focus measuring marks 3 formed in out-of-focus conditions deviated from the best focus by 0.4, 0.8, 1.2, and 1.6 (μm), respectively.

Figure 21:
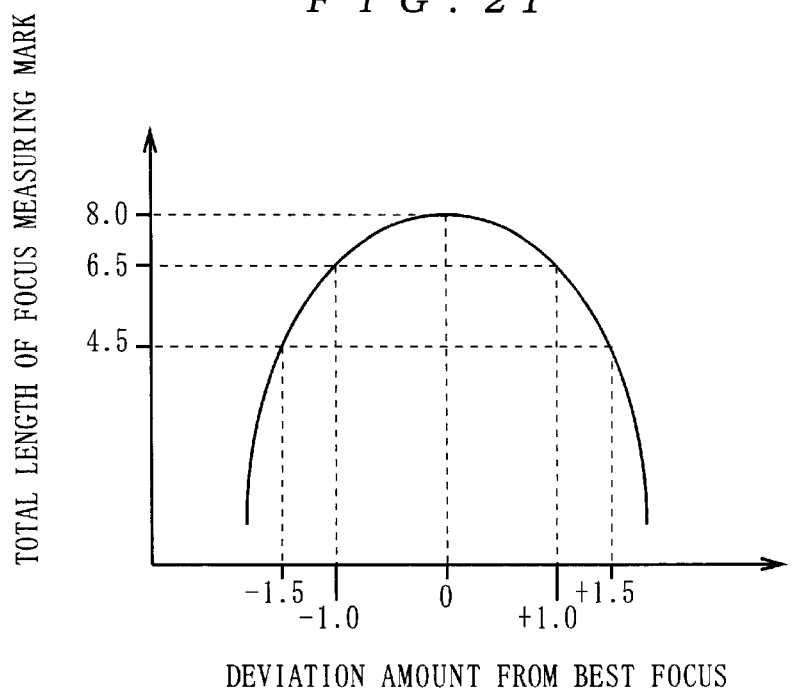
FIG. 21 is a graph showing the relation between the deviation from the best focus and the length of the focus measuring mark in the elongate direction.

FIGS. 3 to 20 show that the length of the focus measuring marks 3 in the elongate direction tends to become shorter as the deviation amount from the best focus becomes larger. When the reticle having the focus measuring mark 3 shown in FIG. 2 is used, the length in the elongate direction is about 8 μm in the best focus condition. However, with defocus of 1 μm, the length in the elongate direction becomes shorter by about 1.5 μm. In this way, the relation between the length in the elongate direction of the focus measuring mark and defocusing is investigated to create and prepare a graph showing a characteristic curve as shown in FIG. 21, which can be applied to a plurality of sets of products regarded as having been processed with a stepper under the same condition. For example, the degree of defocus can be determined by measuring the length in the elongate direction of the patterned focus measuring mark 3 by using a scanning electron microscope (hereinafter referred to as an SEM).

Figure 22:
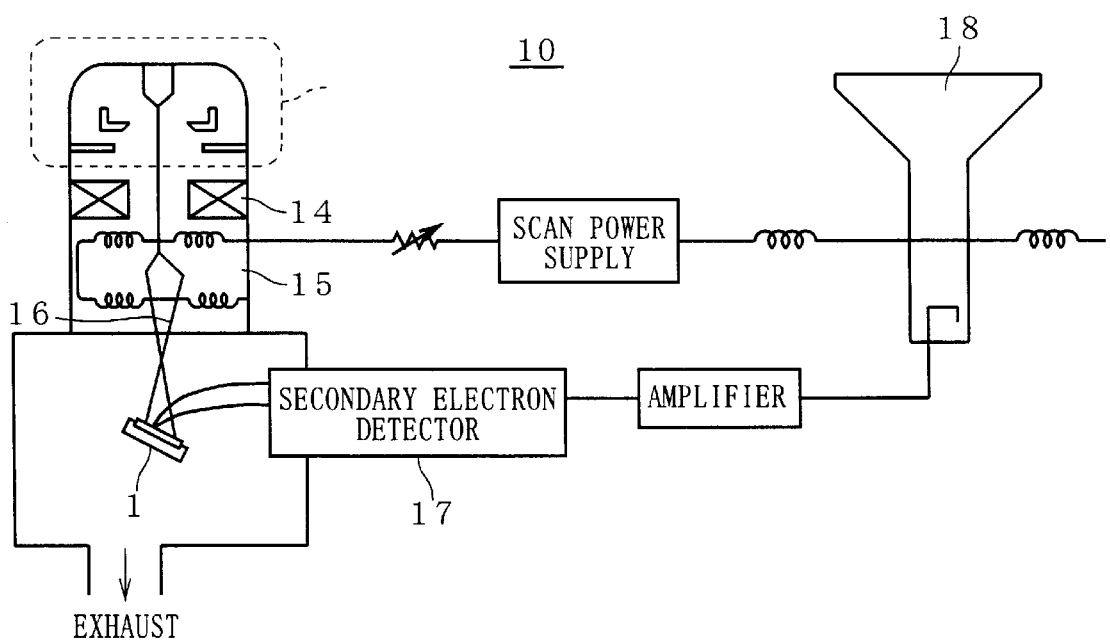
FIG. 22 is a conceptual diagram used to describe the structure of a scanning electron microscope.

FIG. 22 is a conceptual diagram showing the structure of an SEM. The SEM 10 has an electron gun 11 which emits electrons and converges them into beam form. The electron beam emitted from the electron gun 11 is condensed by the condenser lens 14 and deflected by the deflecting coil 15, and the scanning electron beam 16 thus scan on the wafer 1. When the scanning electron beam 16 hits the surface of the wafer 1, secondary electrons are emitted from the surface of the wafer 1. The SEM 10 captures the secondary electrons in the secondary electron detector 17 and converts the amount of secondary electrons into brightness of scanning lines on the cathode-ray tube 18 to show irregularities on the surface of the wafer 1. The images shown in FIGS. 3 to 20 can be observed by using this SEM 10.

Figure 23:
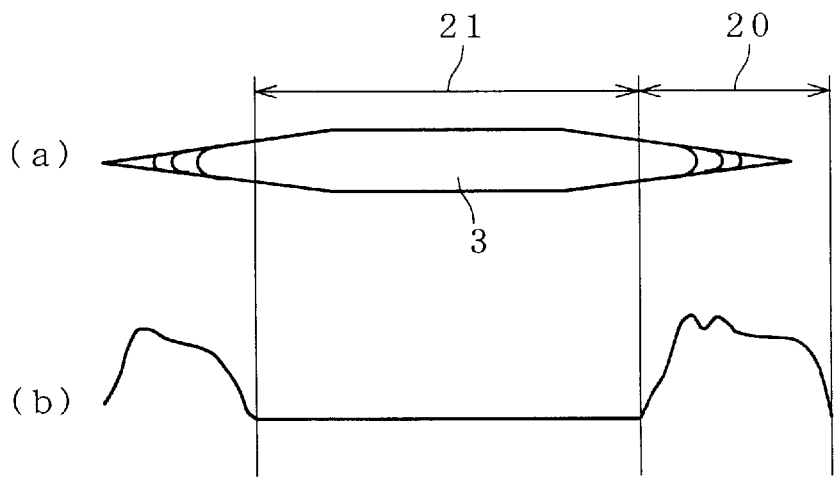
FIG. 23 is a diagram used to explain the relation between an image taken by the scanning electron microscope and a secondary electron signal waveform.
Figure 24:
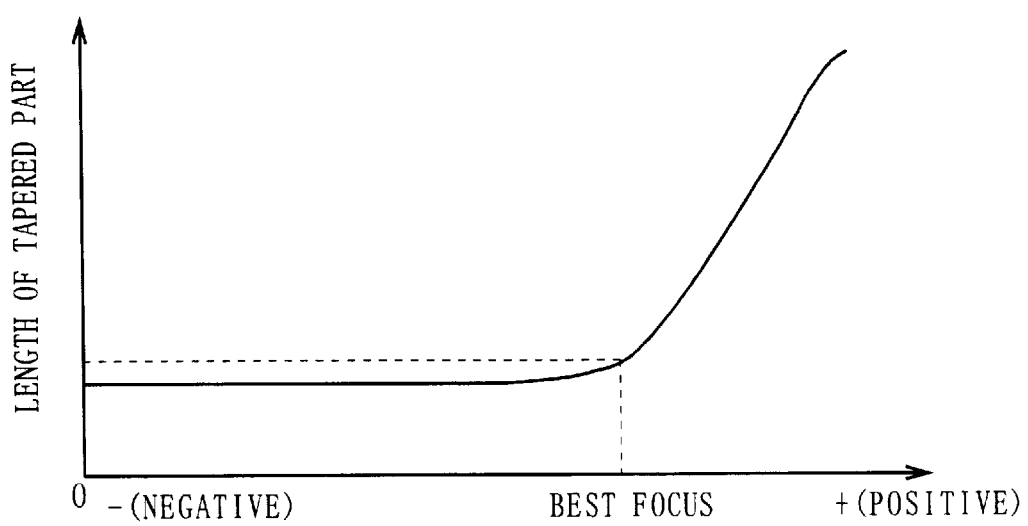
FIG. 24 is a graph showing the relation between the deviation from the best focus and the length of a tapered part of the focus measuring mark.

Measuring the length of the focus measuring mark 3 in the elongate direction shows the magnitude of defocus, but it does not show whether it is out of focus in positive direction or in negative direction. Accordingly, to know whether it is shifted in positive direction or in negative direction from the image observed by the SEM 10, the length of a tapered part 20 as shown in FIG. 23 is measured, for example. FIG. 23 is a diagram used to explain the relation between the SEM image and the waveform of secondary electron signal. In the SEM image of FIG. 23(a), it is possible to distinguish the tapered part 20 from the flat part 21. In the SEM image of FIG. 23(a), for example, the secondary electrons scatter largely in the tapered part 20 in which the thickness of resist of the focus measuring mark 3 becomes smaller as it approaches the end of the focus measuring mark 3. Accordingly the tapered part 20 can clearly be distinguished from the flat part 21 by the secondary electron signal waveform (see FIG. 23(b)), and the length of the tapered part 20 can thus be measured. FIG. 24 is a graph showing the relation between the length of the tapered part and the deviation amount from the best focus. The graph of FIG. 24 shows the tendency of variation of the length of the tapered part 20 shown in FIG. 3 to FIG. 11 in the case of negative resist. When it goes out of focus in the negative direction, the length of the tapered part 20 hardly changes or tends to decrease slightly. When it goes out of focus in the positive direction, the length of the tapered part 20 becomes longer as the degree of defocus becomes larger. This difference shows the direction of defocus. In the relation between the length of the tapered part 20 and the deviation amount from the best focus in the case of positive resist, the length of the tapered part 20 increases when the deviation is negative.

Figure 25:
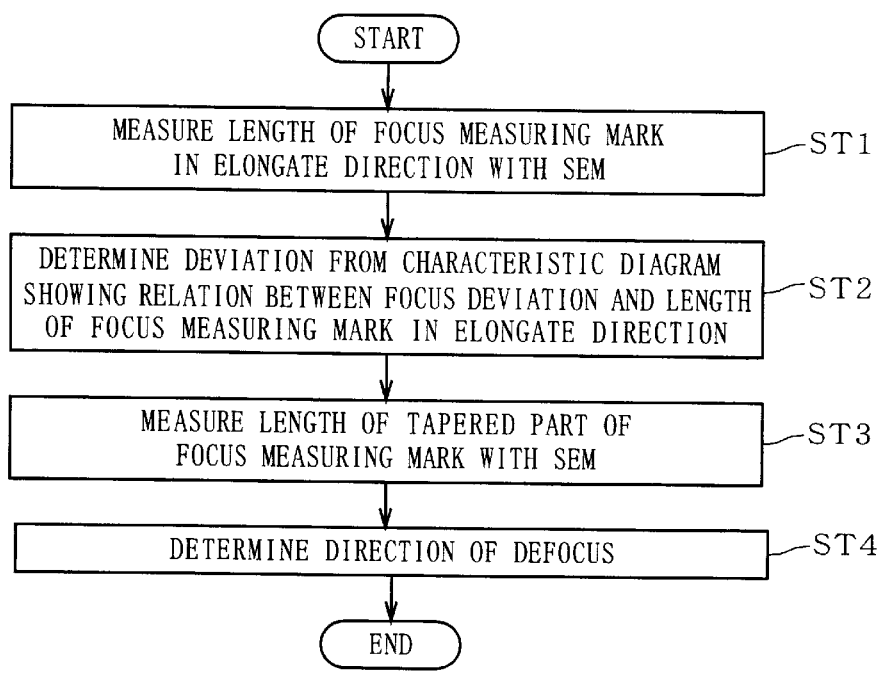
FIG. 25 is a flowchart showing a procedure for measuring the deviation from the best focus.

The above procedure for determining the deviation amount from the best focus can be summarized as shown in the flowchart in FIG. 25. First, resist is patterned by using reticle having the focus measuring mark. The length of the focus measuring mark 3 in the elongate direction is measured by using the SEM 10 (the step ST1). From the measurement in the step ST1, the magnitude of deviation is determined by using the relation between the focus deviation and the length of the focus measuring mark 3 in the elongate direction (the step ST2). Next, the length of the tapered part 20 of the focus measuring mark 3 is measured by using the SEM 10 (the step ST3). From the measurement in the step ST3, the direction of defocus is determined (the step ST4). In this way, with the figure corresponding to the focus measuring mark 3 drawn on the reticle, it is possible to check the focus deviation by taking out some product in the course of manufacture, so that the focusing value for the lot processed next can be set on the basis of the focus deviation in the present lot.

Figure 26:
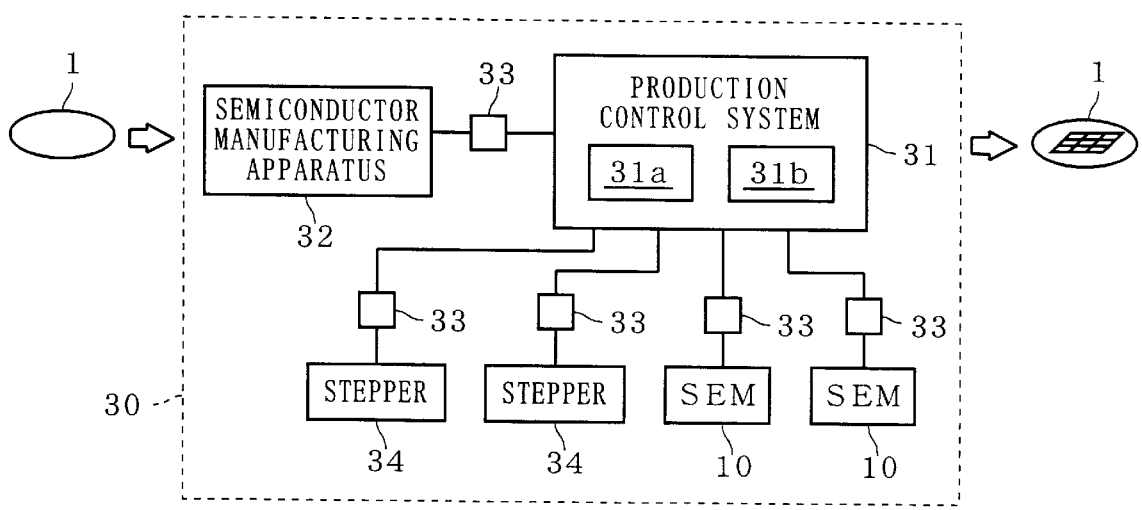
FIG. 26 is a block diagram showing a structure of a production system.

Next, a production system for manufacturing semiconductor devices while statistically processing data about the focus deviations of past lots will be described. FIG. 26 is a block diagram showing an example of a production system. The production system 30 contains the main part of the production control system, 31, which controls the manufacture of semiconductor devices. Steppers 34, SEMs 10, and other semiconductor manufacturing apparatus 32 are connected to the main part 31 of the production control system through reference terminals 33. A plurality of steppers 34, semiconductor manufacturing apparatus 32, and SEMs 10 may be connected to the main part 31 of the production control system. The semiconductor manufacturing apparatus 32 includes a sputtering device, etching device, etc.

In the production control system 31, a plurality of semiconductor integrated circuits are formed on the wafer 1 by using the stepper 34 and other semiconductor manufacturing apparatus 32, for example. The semiconductor devices are manufactured by attaching lead frames, leads, packages, etc. to the semiconductor integrated circuits in fabrication process etc. The main part of the production control system 31 manages data about focus obtained from the steppers 34, SEMs 10, etc. The data about focus include the focus deviation, which are stored in a data base 31b in the main part of the production control system 31. The main part of the production control system 31 contains a focus correcting portion 31a, which calculates a predicted focusing value for focus correction by using the data stored in the data base 31b.

Figure 27:
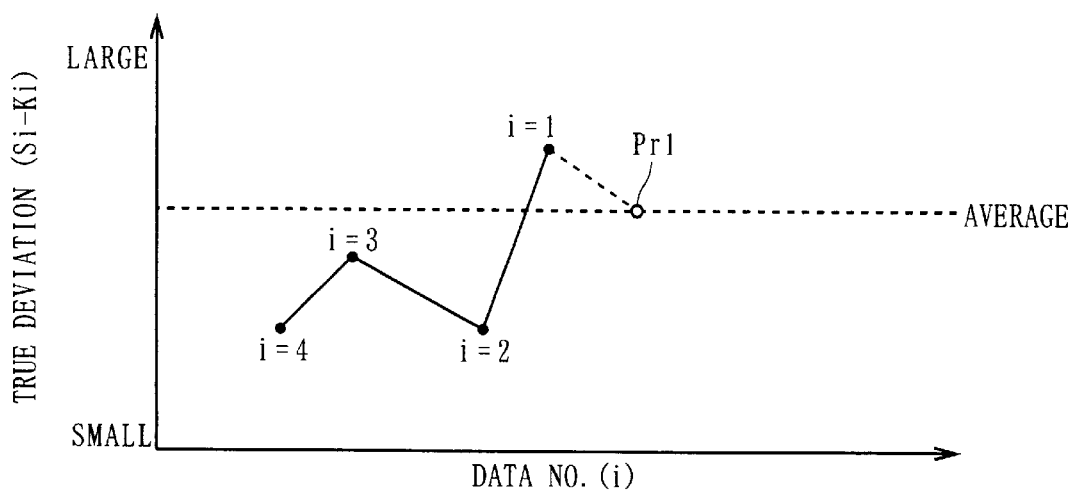
FIG. 27 is a graph showing an example of the relation between the true deviations stored in a data base and the predicted focusing value.
Figure 28:
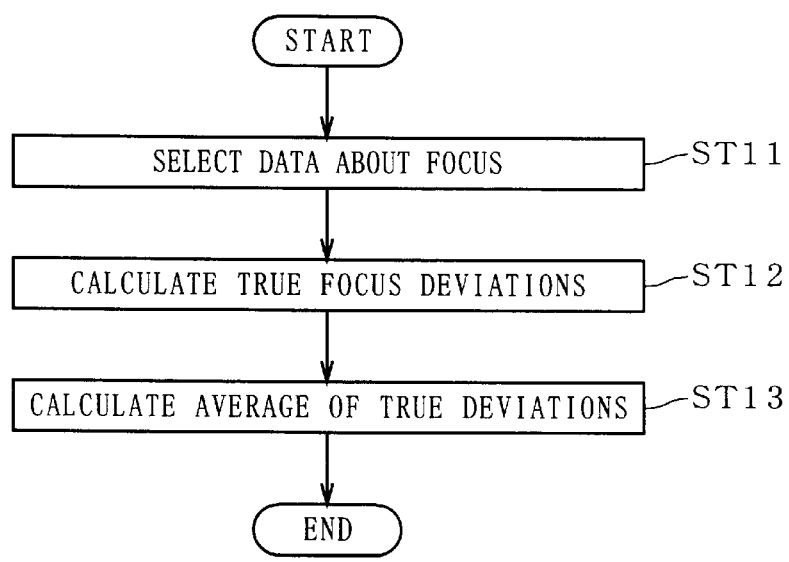
FIG. 28 is a flowchart showing an example of a procedure for calculating the predicted focusing value.

The data base 31b in the main part of the production control system 31 retains data Nos.i =1 to 4 as shown in FIG. 27, for example. In the data, a smaller number indicates older data, and the data are numbered in order with the most recent past data (hereinafter referred to as the latest data) numbered as i=1. For example, the focus correcting portion 31a calculates an average value of the data Nos. i=1 to 4, and the focusing value Pr1 for the stepper 34 is set on the basis of the average value obtained by the statistical process. That is to say, when the predicted focusing value is represented as S0, the individual focusing values as Si, and the deviations measured by the SEM 10 as (-Ki), then the predicted focusing value is given as $$S0=\Sigma(Si-Ki)/n \quad \text{(Eq.1)}$$

Where the total sum ($\Sigma$) is given by summing up all values with i=1 to i=n in the parentheses. In the procedure of this calculation, as summarized in the flowchart of FIG. 28, for example, data about focus used in the calculation are selected first (the step ST11). Since the data about focus include data of different products or too old data, data used in the calculation are selected according to a predetermined criterion. Here, four pieces of new data including the latest data are extracted. That is to say, in this example, data about the newest four lots are extracted as the predetermined number of sets. These are data about products which are regarded as having been stepper-processed under the same condition. In other words, these are data about products manufactured through the same history (process of forming film of the same type and same thickness and process of the same thermal history). Next, true deviations of the focusing values are calculated (the step ST12). The deviation measured by the SEM 10, (-Ki), is the deviation from the focusing value set in the last time, so that the deviation is indicated as a value smaller than the true deviation by the focusing value set last time. Accordingly, it is necessary to correct the focusing value set last time with the deviation measured by the SEM 10 to calculate the true deviation (Si-Ki). Next, an average value of the true deviations is calculated with data about a predetermined number of, the latest and former, sets (e.g., four lots) (the step ST13). The value thus calculated is the focusing value used in the next exposure (hereinafter referred to as a predicted focusing value).

Figure 29:
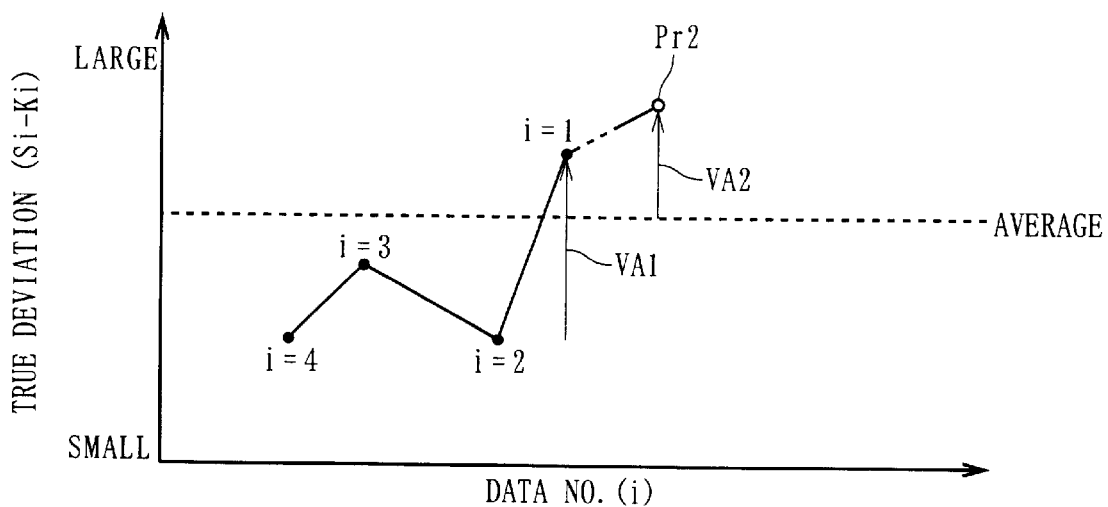
FIG. 29 is a graph showing another example of the relation between the true deviations stored in the data base and the predicted focusing value.
Figure 30:
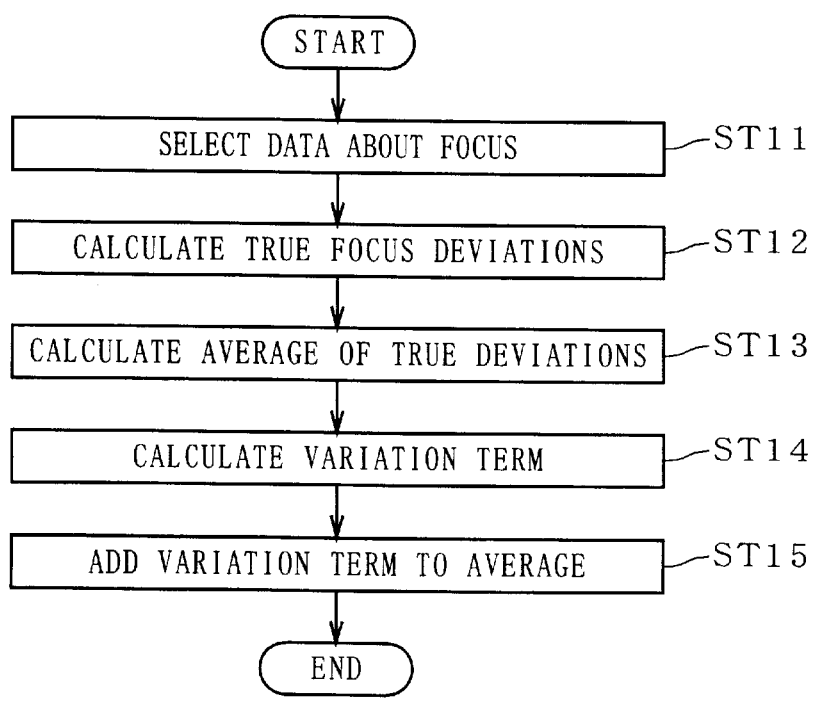
FIG. 30 is a flowchart showing another example of the procedure for calculating the predicted focusing, value.

The predicted focusing value may be obtained by considering a variation between new data. For example, the predicted focusing value Pr2 can be set as shown in FIG. 29 by using the data i=1 to 4 shown in FIG. 27. That is to say, the predicted focusing value Pr2 is determined by adding the value VA2, q times the difference VA1 between the true deviations of the latest data i=1 and the preceding data i=2, to the average value of the data i=1 to 4. Generally, the predicted focusing value S0 is given as $$S0=\Sigma(Si-Ki)/n+q\times\{(S1-K1)-(S2-K2)\} \quad \text{(Eq.2)}$$

Hereinafter, the term $\Sigma(Si-Ki)/n$ in Eq.2 is referred to as an average term, and the term $q\times\{(S1-K1)-(S2-K2)\}$ is referred to as a variation term. The numbers n and q in Eqs.1 and 2 are constants suitably set for each statistical calculation. For example, n is preferably set to 3 or larger, and q is preferably set to such a value as will minimize the variation in the deviation from the best focus. The preferable constants n and q can be derived by experience while repeating the statistical calculation. When the predicted focusing value is calculated with the variation term reflected, the predicted true deviation comes closer to the actual true deviation, which improves the correctness of the focus correction as compared with the case of Eq.1. The variation term can generally be represented as $\Sigma qj\times[(Sj-Kj)-\{S(j+1)-K(j+1)\}]$. Not only the process immediately before and the process before that, but also still former process(es) may be reflected in the calculation. In this case, the value of qj may be individually set. While using the data immediately before is preferred when using the true deviation difference, it is not essential. The procedure of calculating the predicted focusing value will be described referring to the flowchart of FIG. 30. First, similarly to the procedure in which the average value is used as the predicted focusing value, suitable past data about focusing values (data about the true deviations) are extracted from the data base 31b and the average value of the true deviations is calculated (the steps ST11 to ST13). Further, the variation term is calculated by using the data extracted from the data base 31b (the step ST14). The variation term obtained in the step ST14 is added to the average value calculated in the step ST13 to obtain the predicted focusing value S0 (the step ST15).

Figure 31:
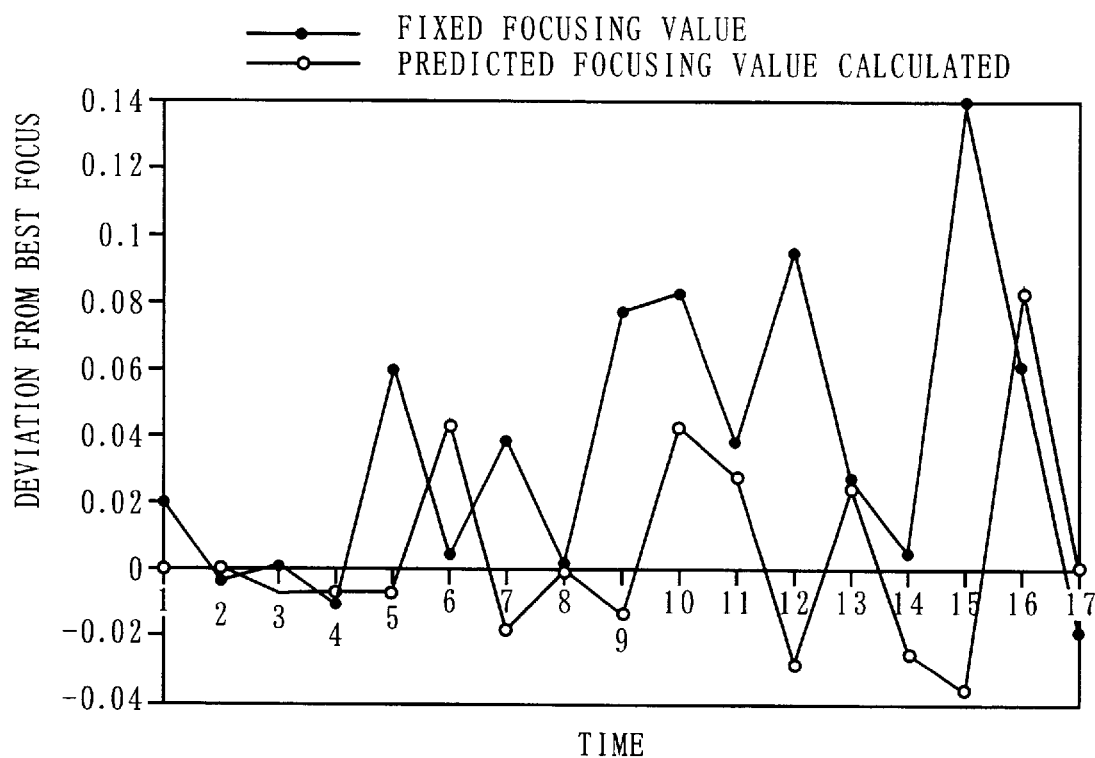
FIG. 31 is a graph showing variations in time of the deviation from the best focus value.

FIG. 31 shows a comparison between process in which the true deviations are calculated with the deviations (−Ki) from the best focus obtained through measurement by the SEM 10 etc. and the values are substituted in the expression to obtain the predicted focusing value S0 for the next lot and process in which the focusing value is not set (when the focusing value is fixed). It shows that the use of the predicted focusing value S0 obtained by using Eq.2 causes the average deviation from the best focus to come closer to zero and the variation becomes smaller.

Second Preferred Embodiment

Figure 32:
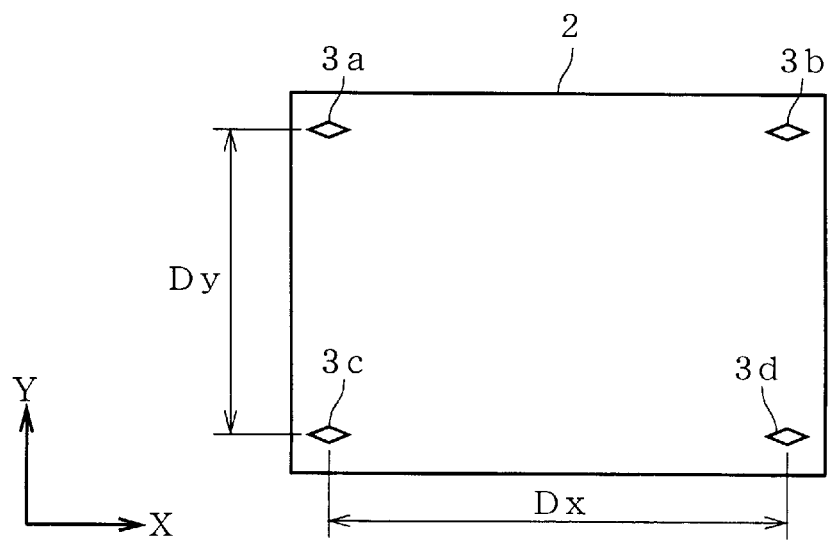
FIG. 32 is a plane view showing an example of arrangement of the focus measuring marks in a shot.

FIG. 32 is a plane view showing the relation between a shot and the focus measuring marks 3 in a focus correcting method of a second preferred embodiment. As shown in FIG. 32, focus measuring marks 3a to 3d are arranged in the four corners of the shot 2. The focus measuring marks 3a and 3c, and the focus measuring marks 3b and 3d, are respectively separated from each other by a predetermined distance Dy ($\mu$m), and the focus measuring marks 3a and 3b and the focus measuring marks 3c and 3d are respectively separated from each other by a predetermined distance Dx ($\mu$m). The focus measuring marks 3a and 3b are on the same y-coordinate, and the focus measuring marks 3c and 3d are on the same y-coordinate. The focus measuring marks 3a and 3c are on the same x-coordinate and the focus measuring marks 3b and 3d are on the same X-coordinate. The X component of the inclination of the shot 2 is defined by the inclination of the straight line connecting the middle point between the focus measuring marks 3a and 3c and the middle point between the focus measuring marks 3b and 3d with respect to the straight line passing through the middle point between the focus measuring marks 3b and 3d and parallel to the X axis. That is to say, the X component Ex of the inclination is given as $$Ex = \{(Sa+Sc)/2 - (Sb+Sd)/2\}/Dx \qquad (Eq.3)$$

Where Sa to Sd respectively represent the true focus deviations ($\mu$m) of the focus measuring marks 3a to 3d. Similarly, the Y component of the inclination of the shot 2 is defined by the inclination of the straight line connecting the middle point between the focus measuring marks 3a and 3b and the middle point between the focus measuring marks 3c and 3d with respect to the straight line passing through the middle point between the focus measuring marks 3c and 3d and parallel to the Y axis. That is to say, the Y component of the inclination is given as $$Ey = \{(Sa+Sb)/2 - (Sc+Sd)/2\}/Dy \qquad (Eq.4)$$

The inclination Ex and Ey is expressed in radian.

Correction to the inclination Ex and Ey can be predicted similarly to the process in the first preferred embodiment. When correcting values for the X, Y components of the inclination are represented as Fxi, Fyi, then the predicted inclination correcting values Fx0 and Fy0 can be given by using the average values, as $$Fx0 = \Sigma(Fxi-Exi)/n \qquad (Eq.5)$$

$$Fy0 = \Sigma(Fyi-Eyi)/n \qquad (Eq.6)$$

The predicted inclination correcting values Fx0 and Fy0 are given by considering the average values and the variation terms, as $$Fx0 = \Sigma(Fxi-Exi)/n + qx \times \{(Fx1-Ex1)-(Fx2-Ex2)\} \qquad (Eq.7)$$

$$Fy0 = \Sigma(Fyi-Eyi)/n + qy \times \{(Fy1-Ey1)-(Fy2-Ey2)\} \qquad (Eq.8)$$

Figure 33:
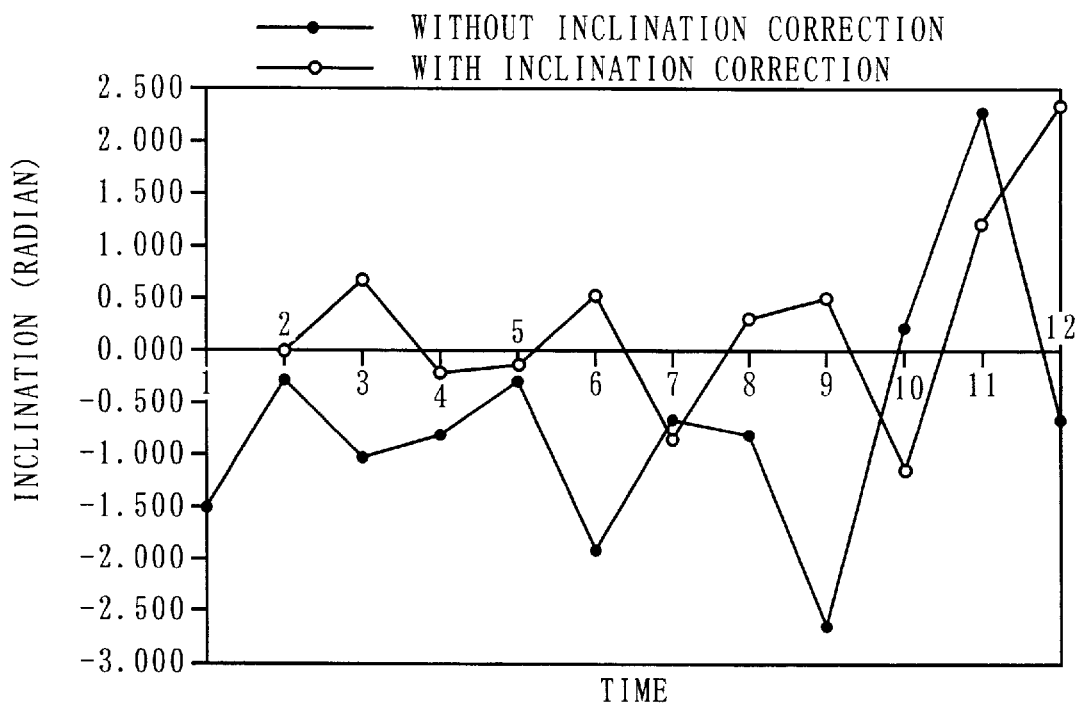
FIG. 33 is a graph showing time variations of inclination of a shot.

The characters n, qx, and qy are constants appropriately set for each statistical calculation. The statistical calculation as shown by Eq.7, Eq.8 is performed by using data of past lots about the values of the inclination components Ex, Ey to calculate the predicted inclination correcting values (Fx0, Fy0), and the main part of the production control system 31 can correct the inclination of the shot of the stepper 4 by using the predicted inclination correcting values Fx0, Fy0 to improve the accuracy of the inclination correction. FIG. 33 is a graph showing variations of the Y component of the inclination for comparing process with the shot inclination correction and process without it. FIG. 33 shows that the inclination correction causes the average value of the inclination to come closer to zero and reduces the range of the variation. Although the second preferred embodiment above has described the case of four focus measuring marks 3, the plane of the shot 2 can be specified with three marks at least, and then the inclination components can be calculated.

Third Preferred Embodiment

Figure 34:
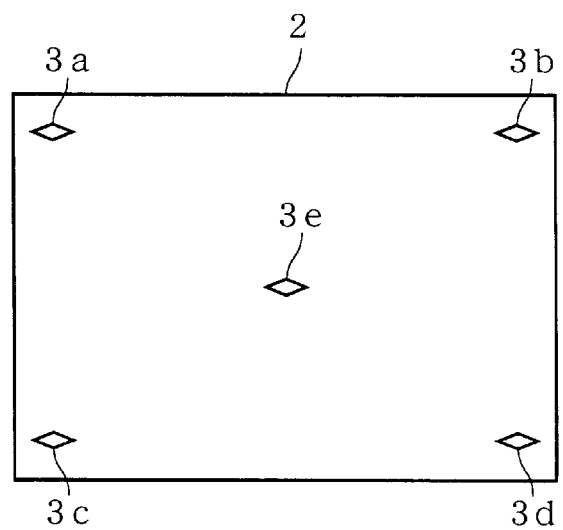
FIG. 34 is a plane view showing another example of arrangement of the focus measuring marks in a shot.
Figure 35:
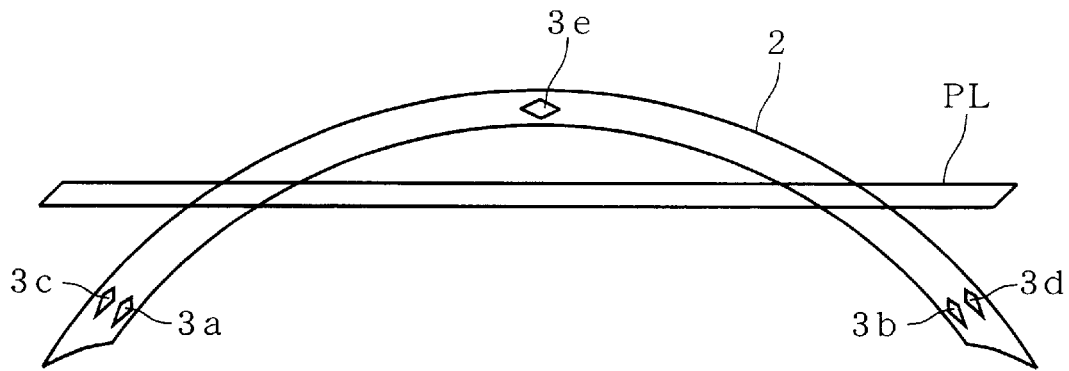
FIG. 35 is a conceptual diagram used to describe the image plane curve.

FIG. 34 is a plane view showing the relation between the shot and the focus measuring marks in a third preferred embodiment. FIG. 35 is a conceptual diagram showing the image plane curve used to explain the outline of the focus correction of the third embodiment. For simplicity, FIG. 35 shows the curve of the shot 2 in an exaggerated manner. The image of the shot 2 forms a smooth curve rising in the center. Due to the image plane curve of the lens of the stepper 4, the image is formed at different positions in the marginal part and the center part of the shot 2. Accordingly the setting for the best focus also differs. That is to say, even when the focus measuring marks 3a to 3d are in the best focus condition, the center focus measuring mark 3e will be out of the best focus due to the curve of the image plane. Hence a plane PL intersecting the straight lines connecting the focus measuring mark 3e and the focus measuring marks 3a to 3d is assumed, and the system is set so as to minimize the deviation from the best focus at the plane PL, on the basis of the deviation from the best focus in the marginal part of the shot 2 and the deviation from the best focus in the center part.

For example, when the true deviations of the focus measuring marks 3a to 3e are represented as Sa to Se, then the deviation Sp from true deviation Se on the plane PL is given as $$Sp = \{Se - (Sa+Sb+Sc+Sd)/4\}/2 \qquad (Eq.9)$$

With the approach to the best focus thus accomplished by considering the image plane curve, it is possible to bring the entirety of the shot 2 closer to the best focus condition as compared with the case in which the marginal part or the center part of the shot 2 is brought into the best focus condition. Although the imaginary plane PL is placed in the middle position in the difference between the marginal part and the center part in the description above, it may be placed closer to the marginal part or the center part instead of being placed in the middle position.

Correction on this plane PL can be predicted, too. When the focusing value is represented by Si and the deviation on the plane PL calculated from the deviations measured by the SEM 10 is represented by (−Spi), then the predicted focusing value S0 can be given by using the average value, as $$S0 = \Sigma(Si-Spi)/n \qquad (Eq.10)$$

The predicted focusing value S0 is given by considering the average value with the variation term, as $$S0 = \sum (Si - Spi)/n + q \times \{(S1 - Sp1) - (S2 - Sp2)\} \qquad (Eq.\ 11)$$

The values n, q are constants appropriately set for each statistical calculation. The statistical calculation as shown by Eq.10, Eq.11 is performed by using data of past lots about the deviation Sp to calculate the predicted focusing value S0, and the main part of the production control system 31 can set the stepper 4 by using the predicted focusing value S0 to improve the accuracy of the focus correction.

Fourth Preferred Embodiment

Figure 36:
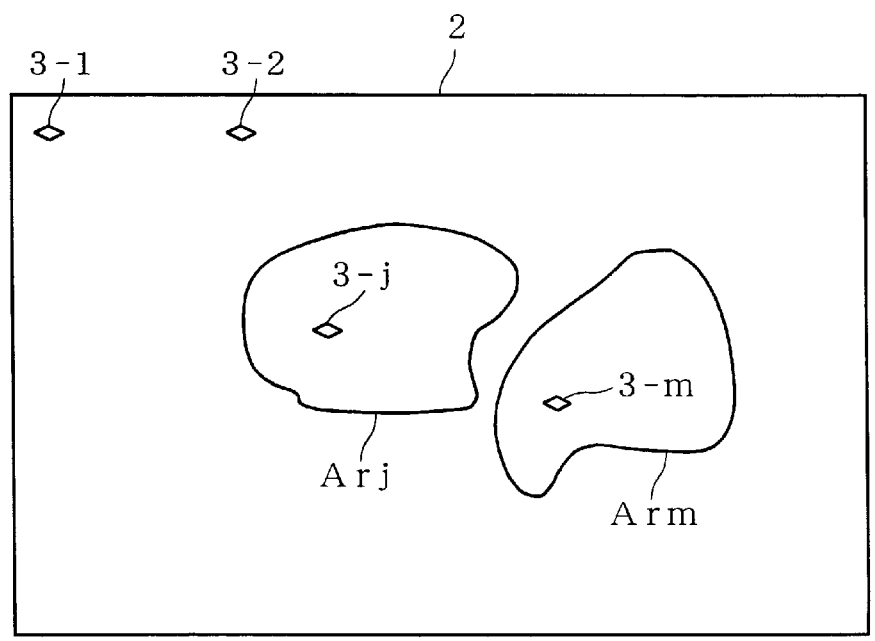
FIG. 36 is a plane view showing another example of arrangement of the focus measuring marks in a shot.

Also in the focus correcting method of a fourth preferred embodiment, a plurality of focus measuring marks 3-1 to 3-m are arranged in one shot 2, as shown in FIG. 36, for example. In FIG. 36, focus measuring marks 3-3 to 3-j−1, and 3-j+1 to 3-m are not shown. The regions around the focus measuring marks 3-1 to 3-m may require different dimensional accuracies. For example, the region Arj around the focus measuring mark 3-j requires higher dimensional accuracy than the region Arm around the focus measuring mark 3-m. In this case, if the true deviation of the focus measuring mark 3-j and the true deviation of the focus measuring mark 3-m are equally handled, the region Arj requiring higher dimensional accuracy may fall short of the standard due to the effect of the deviation of the focus measuring mark 3-m.

Hence, data are weighted so that the deviation of the focus measuring mark near the region requiring higher dimensional accuracy is largely reflected in the setting of the focusing value and the deviation of the focus measuring mark near the region requiring lower dimensional accuracy is less reflected in the setting of the focusing value.

When the deviations of the focus measuring marks 3-1 to 3-m measured by the SEM 10 are represented as (−G1) to (−Gm), then the deviation (−H) of focus obtained by weighting is given as $$H=(k1\times G1+k2\times G2+\ldots +km\times Gm)/(k1+k2+\ldots +km) \qquad (Eq.12)$$

The individual coefficients k1 to km may be set to zero, and then the result is obtained as if the region requiring lower dimensional accuracy have no focus measuring mark.

Correction with the deviation (−H) of focus thus obtained by weighting can also be predicted. When the focusing value is represented as Si, then the predicted focusing value S0 is obtained by using the average value, as $$S0=\Sigma(Si-Hi)/n \qquad (Eq.13)$$

The predicted focusing value S0 is obtained by considering the average value and the variation term, as $$S0 = \sum (Si - Hi)/n + q \times \{(S1 - H1) - (S2 - H2)\} \qquad (Eq.\ 14)$$

The values n, q are constants set for each statistical calculation. The statistical calculation as shown in Eq.13, Eq.14 is performed by using data of past lots about the deviation Hi to predict the predicted focusing value S0, and the main part of the production control system 31 can set the stepper 4 by using the predicted focusing value S0 to improve the accuracy of the focus correction.

Fifth Preferred Embodiment

Figure 37:
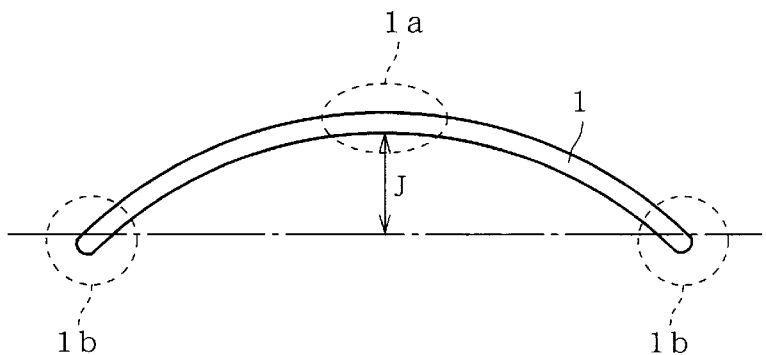
FIG. 37 is a diagram used to explain the amount of remaining warp of the wafer.

The focus correcting method of a fifth preferred embodiment takes warp of the wafer into consideration. As shown in FIG. 37, the peripheral part 1b of the wafer 1 and the center part 1a are at different heights. Applying the focus correcting method of the fifth preferred embodiment while considering the difference in height requires classifying the focus measuring marks formed in shots irradiated multiple times onto the wafer in accordance with the positions on the wafer. For example, the shots 2a to 2d of FIG. 1 are shots irradiated on the peripheral part 1 of the wafer 1, and the focus measuring marks 3p to 3s formed in the shots 2a to 2d are classified into the group of marks arranged in the peripheral part 1b. The shot 2e of FIG. 1 is a shot irradiated on the center part 1a of the wafer 1, and the focus measuring mark 3t formed by the shot 2e is classified into the group of marks arranged in the center part 1a. The amount of remaining warp of the wafer 1, J, is defined by a difference between the deviation W1 from the best focus of the shot in the center part 1a of the wafer 1 and the deviation W2 from the best focus of the shots in the peripheral part 1b of the wafer 1 (J=W1−W2). The deviation of each shot from the best focus may be approximately given by the deviation of one focus measuring mark in one shot, for example, or may be approximately given as an average value of deviations of a plurality of focus measuring marks. When the deviation of the shot is represented by the deviation of one focus measuring mark, it is preferred that the positions of the focus measuring marks in their shots be standardized among shots. For example, it is given as a difference between the deviation of the focus measuring marks 3p to 3s from the best focus and the deviation of the focus measuring mark 3t from the best focus. The deviation of the focus measuring marks 3p to 3s located in the peripheral part 1b from the best focus may be obtained from one focus measuring mark, or may be obtained by averaging the deviations of a plurality of focus measuring marks. Usually, the wafer 1 is correctly leveled, so that the height of the peripheral part 1b can correctly be represented by using one focus measuring mark in the peripheral part 1b.

The amount J of the remaining warp of the wafer 1 can be predicted similarly to the deviation S0 from the best focus in the first preferred embodiment. The predicted amount of the remaining warp J0 can be given as follows by using an average value of past data Ji (i=1 to n) stored in the data base 31b, for example.

$$J0=\Sigma Ji/n \qquad (Eq.15)$$

Or, by considering the variation term, the predicted amount of the remaining warp J0 can be given as $$J0=\Sigma Ji/n+q\times (J1-J2) \qquad (Eq.16)$$

The past data Ji used in one statistical calculation must be those subjected to the same history, at least. For example, they can be data of the same kind of products, or data about products of different kinds but having films of the same kind and same thickness on the wafer 1 and subjected to the same thermal history can be processed as data subjected to the same history.

The equation for calculating the focusing value M for individual shot in the wafer 1 is given as follows by considering the predicted amount of the remaining warp J0.

$$M = J0 \times (\text{distance from the center of the wafer 1 to individual shot} \div \text{distance from the center of the wafer 1 to the shots in the peripheral part of the wafer}) \times W1 \quad (\text{Eq.17})$$

Using the focusing value M obtained by Eq.17 as the focusing value of the individual shot in exposure improves the accuracy as compared with the case in which the deviation of one shot 2 in the wafer 1 is used for the focusing value of all shots 2, and simplifies the measurement and calculation as compared with the case in which measurement and calculation are repeated for all shots 2 in the wafer 1 to obtain the focusing values.

The process described below may be included in the statistical processing of data described in the first to fifth preferred embodiments.

Figure 38:
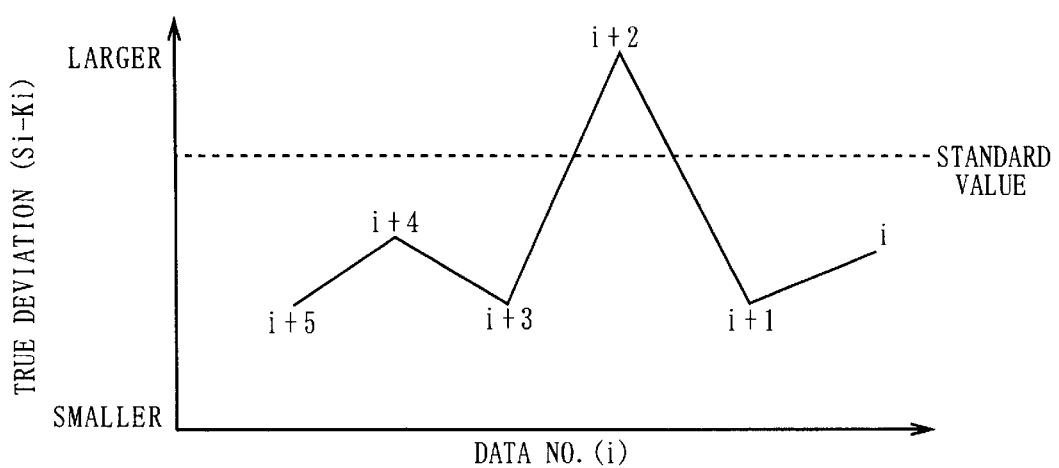
FIG. 38 is a graph showing the relation between the order of lots processed and the true deviations of the lots.

FIG. 38 is a graph showing the relation between the order of lots processed and the true deviations of the lots. The data shown in the graph of FIG. 38 are the data selected through the same process as the step ST11 in FIG. 28, for example. The true deviation of the data No.i+2 shown in FIG. 38 is prominent among the true deviations of other data numbers. It is assumed that this was caused by malfunction of the stepper 4, error in measurement in an overlay check device 5, or mistake in operation by operator. When the predicted stepper correcting value is calculated by using the true deviation of the data No.i+2, the stepper setting values of the data Nos.i and i +1 become larger than the optimum stepper setting values as shown by the solid line in FIG. 39, and then the data Nos.i, i+1 may not up to the standard value subsequently to the data of No.i+2. The operation error of the operator etc. which will cause such a large deviation of the value is temporary and has a large value, so that it seriously affects the calculation of the predicted stepper correcting value and is usually not repeated in the next lot. Hence, calculating the predicted stepper correcting value by taking such data into account will probably decrease the accuracy of the focus correction, and then the deviation may possibly go out of the standard as shown by the solid line in FIG. 40.

Figure 41:
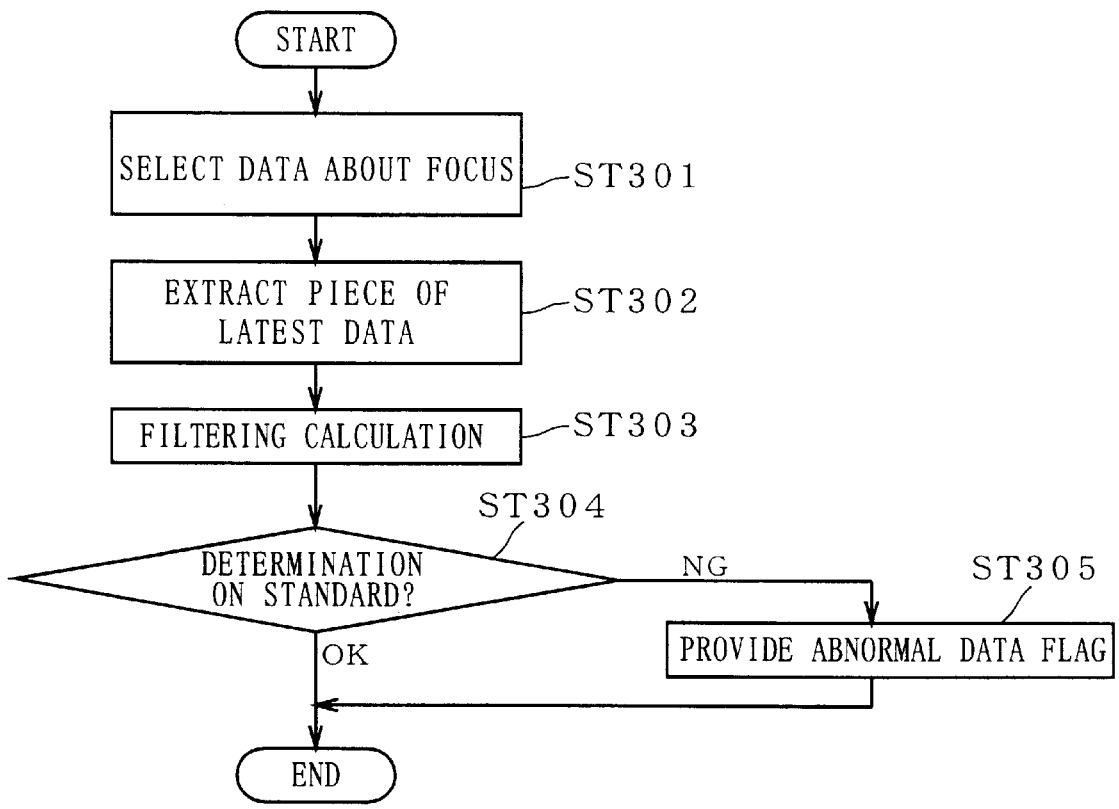
FIG. 41 is a flowchart showing a procedure for excluding abnormal data from calculation of the predicted stepper correcting value.

In the focus correcting method of the first to fifth preferred embodiments, such abnormal data like the data No.i +2 shown in FIG. 38 can be excluded from the calculation of the predicted stepper correcting value. FIG. 41 is a flowchart showing the procedure. The processing shown in FIG. 41 is performed when entering data into the data base 31b. First, in the step ST301, data are selected similarly to the step ST11 in FIG. 28. Next, in the step ST302, a piece of the latest data is extracted from the selected data. The latest data is the newest one in each group selected to be used to calculate the predicted stepper correcting value. In the step ST303, the following calculation is carried out.

$$\text{Amount for filtering} = \text{the true deviation immediately after the deviation was measured by SEM} - \text{the true deviation just before} \quad (\text{Eq.18})$$

The true deviation just before is the data extracted in the step ST302. In the step ST304, the amount for filtering obtained by calculating Eq.18 in the step ST303 and a predetermined standard value are compared. For example, when the standard value>amount for filtering, the determination is "pass" (OK). When the standard value≦amount for filtering, the determination is "fail" (NG). When the determination of fail is issued, the process proceeds to the step ST305, and a flag indicating the "fail" determination (NG) is entered into the same line as the true deviation immediately after the deviation was measured by SEM. That is to say, data about the true deviation provided with the flag indicates that the determination was "fail." The setting is conducted so that the data provided with the flag is not selected in the step ST201 in FIG. 28, for example. This setting enables the filtering function for excluding abnormal data.

Figure 39:
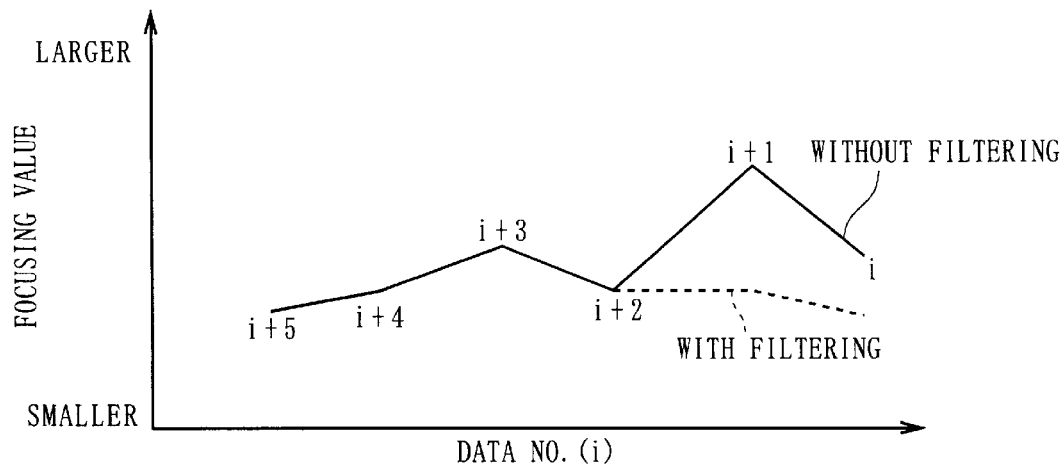
FIG. 39 is a graph used to explain effect of filtering on the focusing value.
Figure 40:
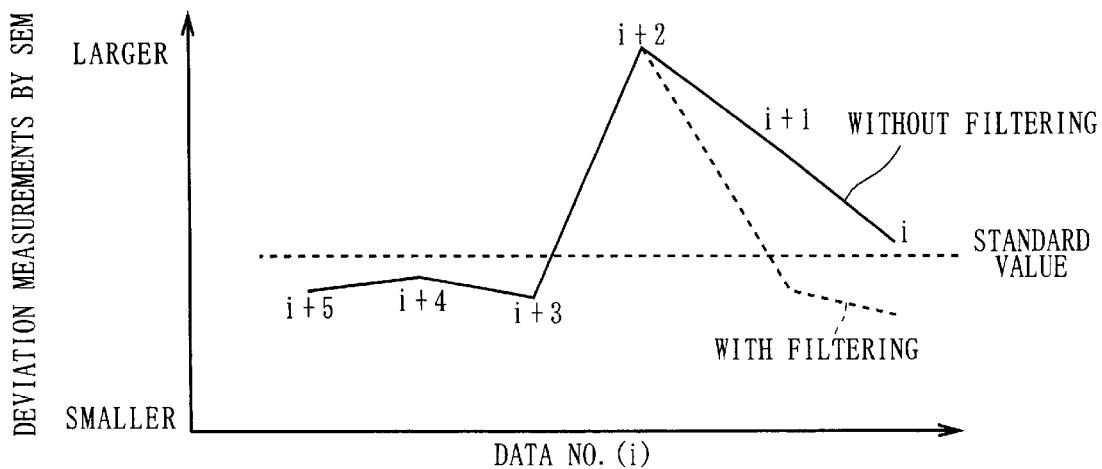
FIG. 40 is a graph showing effect of filtering on the deviation measurements.

In FIG. 39 and FIG. 40, the broken lines show the stepper setting value and the deviation measured by SEM when the filtering function is applied. The application of the filtering function excludes the data No.i+2 from the data used in calculation. Then it is not reflected in the predicted stepper correcting value, which prevents the stepper setting value from becoming larger than required so that the deviation measured by SEM will more possibly satisfy the standard value. That is to say, including the filtering function in the focus correcting method enhances and improves the accuracy of the focus correction.

Figure 42:
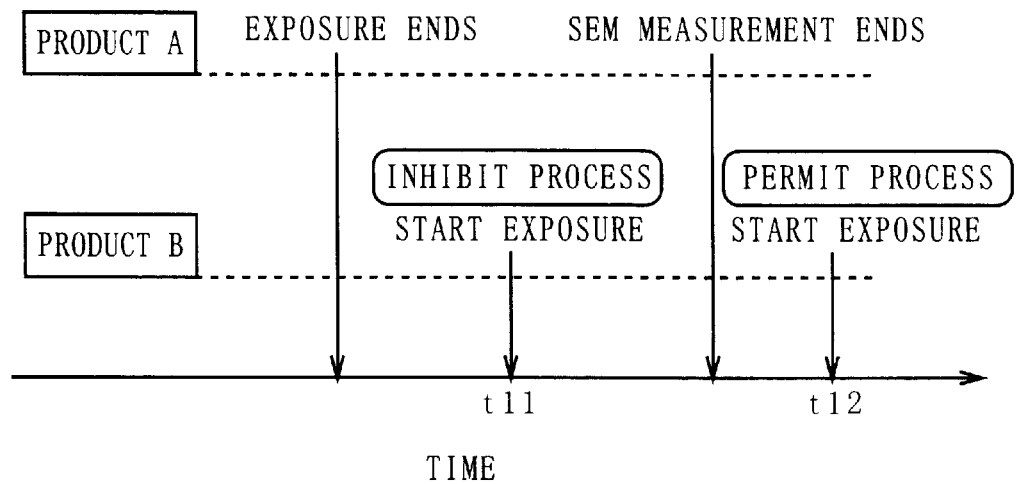
FIG. 42 is a timing chart showing processing to a produce A and a product B.

FIG. 42 is a timing chart showing processes to a product A and a product B. The exposure restriction will now be described referring to FIG. 42. It is assumed here that the product A is processed in the stepper 4 and then the product B is processed. At this time, data about the product A and the product B are data classified in the same group when selected in the step ST11 in FIG. 28, for example. When the product B is exposed after the exposure process to the product A has been finished, there are two ways: the exposure is started at a time (time t11) before the measurement of the deviation of the product A by SEM is finished, or the exposure is started at a time (time t12) after the measurement of the deviation of the product A by SEM is finished. The exposure restriction means the processing of inhibiting the exposure process to the product B before the measurement of deviation of the produce A by SEM is finished (at time t11) and allowing the exposure process to the product B after the measurement of deviation of the product A is finished (at time t12). With this strategy, the latest focus data can always be utilized in the exposure process to the product B, which will more probably improve the accuracy of the focus correction. Also, when the product A falls short of the standard, the data about focus of the product A cannot be used, which reduces the possibility that the product B falls short of the standard.

Figure 43:
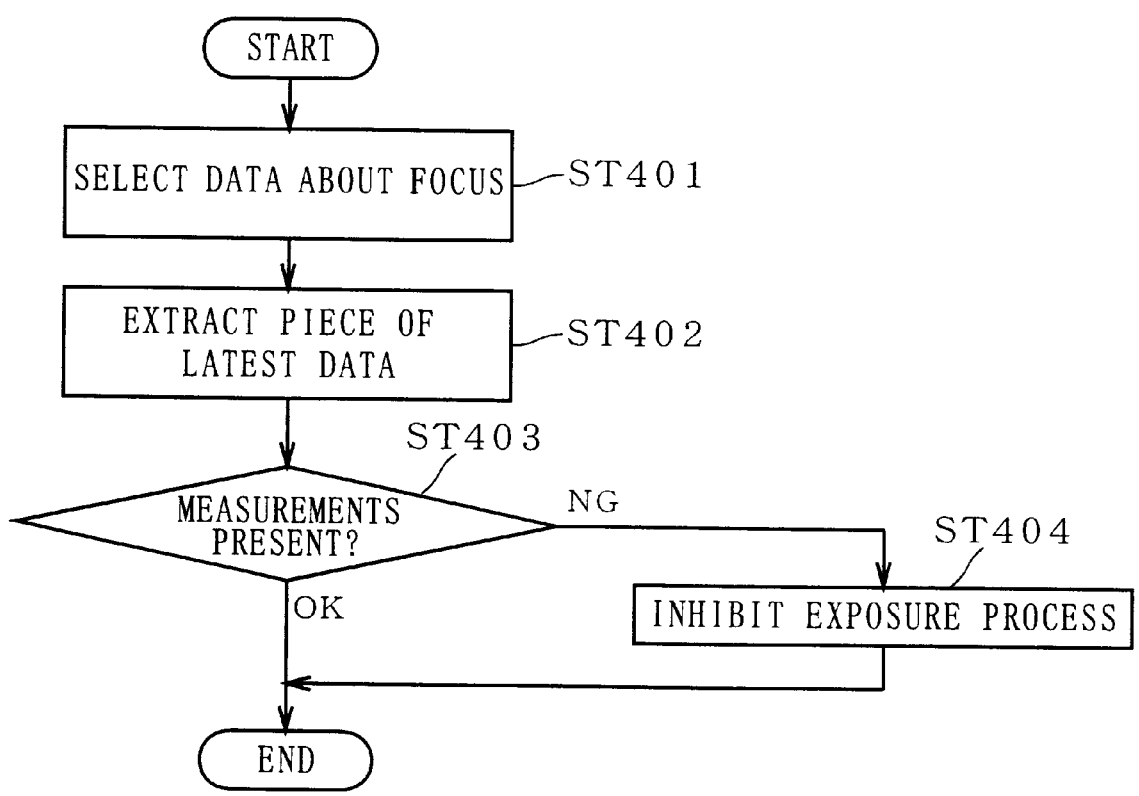
FIG. 43 is a flowchart showing a procedure of exposure restriction in the focus correcting method.

FIG. 43 is a flowchart showing the procedure of the exposure restriction in the focus correcting method. In the step ST401, similarly to the step ST301, data about focus are selected. After the step ST401, a piece of the latest data is extracted in the step ST402. This step ST402 is similar to the step ST302. The data extracted to be utilized is a deviation-measurement-by-SEM finished flag which is provided to data about focus. This measurement finished flag is recorded when the data is entered into the data base 31b, for example. Step ST403 checks presence/absence of the measurement finished flag. When the measurement finished flag is absent, process inhibiting information for indicating inhibition of the exposure process is outputted to inhibit the stepper processing to that product.

While the invention has been described in detail, the foregoing description is in all aspects illustrative and not restrictive. It is understood that numerous other modifications and variations can be devised without departing from the scope of the invention.

I claim:

1. A focus correcting method for use in an aligner capable of adjustment of focus position by setting a focusing value, comprising the steps of:

(a) forming a resist pattern with at least one focus measuring mark by exposing a resist by said aligner;

(b) measuring length of said at least one focus measuring mark in elongate direction;

(c) measuring length of a tapered part of said at least one focus measuring mark in which said resist becomes thinner toward an end of said at least one focus measuring mark; and (d) determining a magnitude of deviation from a best focus on the basis of a measurement in said step (b) and also determining direction of said deviation from said best focus on the basis of a measurement in said step (c) to obtain a deviation amount from said best focus, and then setting said focusing value on the basis of said deviation amount from said best focus.

2. The focus correcting method according to claim 1, further comprising the step of (e) storing data about said deviation amount from said best focus every time said step (d) is repeated for each of a plurality of sets of products of a same type, wherein said step (d) comprises the step of statistically processing said data to calculate a predicted focusing value which enables said best focus in exposure, and setting the focusing value on the basis of said predicted focusing value.

3. The focus correcting method according to claim 2, wherein said step (e) comprises the step of defining a sum of said focusing value and said deviation amount from said best focus as a true deviation, and storing the true deviations about said plurality of sets of products as said data, and in said step (d), the true deviations about a predetermined number of sets of products are extracted from said data stored in said step (e) and an average value of said true deviations about said predetermined number of sets of products is used as said predicted focusing value.

4. The focus correcting method according to claim 2, wherein in said step (d), true deviations about a predetermined number of sets of products are calculated from said data stored, a value proportional to a difference between the true deviations about successively manufactured at least two sets of products in said plurality of sets of products is added to an average value of the true deviations about said predetermined number of sets of products, and a sum of said average value and said difference is used as said predicted focusing value.

5. The focus correcting method according to claim 1, wherein said at least one focus measuring mark is including a plurality of focus measuring marks, and with said plurality of focus measuring marks arranged in one shot, inclination of said shot is calculated on the basis of the true deviations of said resist pattern from said best focus in individual positions of said plurality of focus measuring marks, and said predicted focusing value is obtained by considering the inclination.

6. The focus correcting method according to claim 1, wherein said at least one focus measuring mark is including a plurality of focus measuring marks, and with said plurality of focus measuring marks arranged in peripheral part and center part of one shot, said predicted focusing value is calculated on the basis of a value between the true deviation from said best focus in said peripheral part of said shot and the true deviation from said best focus in said c ent er part of said shot.

7. The focus correcting method according to claim 1, wherein said at least one focus measuring mark is including a plurality of focus measuring marks, and with said plurality of focus measuring marks arranged in a plurality of positions in one shot, the true deviations from said best focus measured at said plurality of positions are weighted in accordance with pattern layout and arrangement in said shot and averaged so as to calculate said predicted focusing value.

8. The focus correcting method according to claim 1, wherein said at least one focus measuring mark is including a plurality of focus measuring marks, and with one of said plurality of focus measuring marks arranged in one position in one shot, an amount of remaining warp of said wafer is calculated on the basis of the deviation amounts of said plurality of focus measuring marks formed in several positions on said wafer in a plurality of exposures, and said predicted focusing value is obtained by considering said amount of remaining warp.

9. The focus correcting method according to claim 1, wherein said at least one focus measuring mark is a polygon having at least one corner having an angle of 90 or smaller.

10. A method of manufacturing a semiconductor device using an aligner in which focus is corrected by using a given focus correcting method and focus position can be adjusted by setting a focusing value, comprising the steps of:

(a) setting the focusing value; and (b) manufacturing semiconductor devices by using the aligner in which the focus position is adjusted by setting said focusing value;

wherein said step (a) comprises the steps of, (c) forming a resist pattern with at least one focus measuring mark by exposing a resist by said aligner;

(d) measuring length of said at least one focus measuring mark in elongate direction;

(e) measuring length of a tapered part of said at least one focus measuring mark in which said resist becomes thinner toward an end of said at least one focus measuring mark; and (f) determining a magnitude of deviation from a best focus on the basis of a measurement in said step (d) and also determining direction of said deviation from said best focus on the basis of a measurement in said step (e) to obtain a deviation amount from said best focus, and then setting said focusing value on the basis of said deviation amount from said best focus.

* * * * *